(12) United States Patent
El et al.

(10) Patent No.: US 8,291,150 B2
(45) Date of Patent: Oct. 16, 2012

(54) TABLE DEVICE, VARIABLE LENGTH CODING APPARATUS, VARIABLE LENGTH DECODING APPARATUS, AND VARIABLE LENGTH CODING AND DECODING APPARATUS

(75) Inventors: Tomomi El, Chiyoda-ku (JP); Noriyuki Minegishi, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 514 days.

(21) Appl. No.: 12/515,841

(22) PCT Filed: May 9, 2007

(86) PCT No.: PCT/JP2007/059603
§ 371 (c)(1),
(2), (4) Date: May 21, 2009

(87) PCT Pub. No.: WO2008/087750
PCT Pub. Date: Jul. 24, 2008

(65) Prior Publication Data
US 2010/0057810 A1  Mar. 4, 2010

(30) Foreign Application Priority Data
Jan. 19, 2007 (JP) ................... 2007-010615

(51) Int. Cl.
*G06F 12/00* (2006.01)
(52) U.S. Cl. ............... 711/6; 707/797; 707/914; 711/1; 711/202; 341/50; 341/51; 341/67
(58) Field of Classification Search ............ 341/50, 341/51, 67; 707/797, 914; 711/1, 6, 202
See application file for complete search history.

(56) References Cited

U.S. PATENT DOCUMENTS
3,675,211 A  7/1972  Raviv
(Continued)

FOREIGN PATENT DOCUMENTS
JP   8 30432   2/1996
(Continued)

OTHER PUBLICATIONS
Tomomi El, et al., "A Dynamic Reconfigurable VLC/D Table for High Performance Multi Standards VLC/D Processor", The Institute of Electronics, information and Communication Engineers (IEICE) technical report, The Institute if Electronics, Information and Communication Engineers, vol. 104, No. 476, (CPSY2004-38), Nov. 25, 2004, pp. 35-40 (plus 2 cover pages).
(Continued)

*Primary Examiner* — Cheyne Ly
(74) *Attorney, Agent, or Firm* — Oblon, Spivak, McClelland, Maier & Neustadt, L.L.P.

(57) ABSTRACT

A table device includes a match cell number output unit 25 for outputting a match cell number showing a cell PE which outputs a matching signal, and an address decoder 26 for specifying a node from among nodes in a search tree which construct a conversion table, the node corresponding to the match cell number. The table device acquires a data conversion value assigned to the above-mentioned node from a configuration memory 21, and, when the data conversion value is data showing a coded result or the like, outputs the data conversion value to outside the table device, whereas when the data conversion value is a branch code of the search tree, updates the cell PE to which a comparison instruction signal is furnished.

12 Claims, 22 Drawing Sheets

U.S. PATENT DOCUMENTS

| | | | |
|---|---|---|---|
| 3,925,780 A * | 12/1975 | Van Voorhis | 341/63 |
| 5,351,047 A * | 9/1994 | Behlen | 341/67 |
| 5,541,595 A * | 7/1996 | Meyer | 341/67 |
| 5,561,690 A * | 10/1996 | Park | 375/340 |
| 5,604,499 A | 2/1997 | Miyagoshi et al. | |
| 5,642,114 A | 6/1997 | Komoto et al. | |
| 5,696,507 A * | 12/1997 | Nam | 341/67 |
| 5,796,356 A | 8/1998 | Okada et al. | |
| 5,821,886 A | 10/1998 | Son | |
| 5,821,887 A * | 10/1998 | Zhu | 341/67 |
| 5,907,637 A | 5/1999 | Murashita et al. | |
| 2002/0167424 A1* | 11/2002 | Kondo et al. | 341/50 |
| 2004/0021593 A1* | 2/2004 | Park et al. | 341/67 |
| 2005/0156761 A1* | 7/2005 | Oh | 341/67 |
| 2007/0182602 A1* | 8/2007 | Zhan et al. | 341/67 |

FOREIGN PATENT DOCUMENTS

| | | |
|---|---|---|
| JP | 8 316848 | 11/1996 |
| JP | 2000-59234 | 2/2000 |
| JP | 2000 151419 | 5/2000 |
| JP | 2001-184870 | 7/2001 |
| JP | 2001 308715 | 11/2001 |
| JP | 2002-261623 | 9/2002 |
| JP | 2006 101171 | 4/2006 |
| JP | 2007-13856 | 1/2007 |

OTHER PUBLICATIONS

Japanese Office Action issued Nov. 16, 2010, in Patent Application No. 2008-553947 (with English-language translation).

Noriyuki Minegishi, et al., "Dynamic Reconfigurable Variable-Length Processor Core with 30 fr/s HDTV to H.264, MPEG-2 and MPEG-4", The Transactions of the Institute of Electronics, Information and Communication Engineers, vol. J89-D, No. 6, Jun. 1, 2006, pp. 1091-1100.

European Search Report and European Search Opinion issued Jun. 29, 2012 to European patent application No. 07743038.7.

Bai-Jue Shieh et al., "A New Approach of Group-Based VLC Codec System with Full Table Programmability", IEEE Transactions on Circuits and Systems for Video Technology, vol. 11, No. 2, pp. 210-221, Feb. 2001.

* cited by examiner

| Variable Length Code (Binary Number) | Value (Decimal Number) |
|---|---|
| 1 | 4 |
| 001 | 3 |
| 010 | 2 |
| 011 00 | 10 |
| 011 01 | 1 |
| 011 10 | 6 |
| 000 00 | 9 |
| 000 01 | 11 |
| 000 10 | 12 |
| 011 1100 | 5 |
| 011 1101 | 7 |
| 011 1110 0000 | 8 |
| . . . | . . . |

FIG. 9

| Total Coeff (Decimal Number System) | Trailing Ones (Decimal Number System) | Total Coeff (Uppermost Five Bits) /Trailing Ones (Lowermost Two Bits) | Variable Length Code (Binary System) |
|---|---|---|---|
| 0 | 0 | 00000 00 | 1 |
| 1 | 0 | 00001 00 | 0001 01 |
| 1 | 1 | 00001 01 | 01 |
| 2 | 0 | 00010 00 | 000 0111 |
| 2 | 1 | 00010 01 | 0001 00 |
| 4 | 0 | 00100 00 | 0000 0001 11 |
| 4 | 1 | 00100 01 | 0000 0011 0 |
| 4 | 2 | 00100 10 | 0000 0101 |
| 5 | 0 | 00101 00 | 0000 0000 111 |
| 5 | 1 | 00101 01 | 0000 0001 10 |
| ... | ... | ... | ... |
| 15 | 1 | 01111 01 | 0000 0000 0000 1010 |
| 16 | 0 | 10000 00 | 0000 0000 0000 0100 |
| 16 | 1 | 10000 01 | 0000 0000 0000 0110 |
| 16 | 2 | 10000 10 | 0000 0000 0000 0101 |

| Variable-Toned Code (Binary Number) | Value (Decimal Number) | Degree of Match (%) |
|---|---|---|
| 1 | 4 | 40 |
| 001 | 3 | 14 |
| 010 | 2 | 12 |
| 011 00 | 10 | 5 |
| 011 01 | 1 | 5 |
| 011 10 | 6 | 5 |
| 000 00 | 9 | 4 |
| 000 01 | 11 | 4 |
| 000 10 | 12 | 3 |
| 011 1100 | 5 | 2 |
| 011 1101 | 7 | 1 |
| 011 1110 0000 | 8 | 1 |
| . . . . . | . . . | . . . |

66%

TABLE DEVICE, VARIABLE LENGTH CODING APPARATUS, VARIABLE LENGTH DECODING APPARATUS, AND VARIABLE LENGTH CODING AND DECODING APPARATUS

FIELD OF THE INVENTION

The present invention relates to a table device which can support various variable length coding methods and various variable length decoding methods including international standard methods, a variable length coding apparatus which implements such a table device therein, a variable length decoding apparatus which implements such a table device therein, and a variable length coding and decoding apparatus which implements such a table device therein.

BACKGROUND OF THE INVENTION

Various improvements have been made to variable length coding methods and variable length decoding methods used for moving images in consideration of uses of these methods, and so on. As international standard coding methods, for example, H.261, H.263, MPEG1, MPEG 2, MPEG4, and so on are provided.

A conventional variable length coding and decoding apparatus stores table data corresponding to various coding methods in a table memory (table data include a variable length coding code corresponding to combination data about a combination of the number of zero runs and a level value and the code length of the variable length coding code, and are stored at an address corresponding to the combination data) so as to support various types of variable length coding/decoding including international standard methods without persisting in using its own variable length coding/decoding.

Furthermore, a variable length coding and decoding apparatus which has a variable length coding unit and a variable length decoding unit having different circuit structures, and which has a variable length coding function and a variable length decoding function converts input data into an address in a table memory when extracting desired table data from the table memory (refer to patent reference 1).

Although a conventional variable length coding and decoding apparatus can support various variable length coding/decoding methods including international standard methods, the conventional variable length coding and decoding apparatus has to include a coding circuit and a decoding circuit separately because the circuit structure used for variable length coding and that used for variable length decoding differ from each other.

Furthermore, because a table for storing a variable length coding code and the code length of the variable length coding code is implemented in a memory, it is necessary to make the bit width of the memory match the longest variable length coding code, and therefore a useless memory area is produced for a variable length coding code having a shorter code length.

In addition to the above-mentioned variable length coding and decoding apparatus, a variable length coding and decoding apparatus which eliminates the necessity of disposing a coding circuit and a decoding circuit separately to prevent occurrence of any useless memory area has been developed (for example, refer to patent reference 2).

More specifically, the variable length coding and decoding apparatus disclosed in patent reference 2 is comprised of components as mentioned below and its components which are not commonly used at the time of coding and at the time of decoding are limited to only an unpack unit and a pack unit, thereby eliminating the necessity of disposing a coding circuit and a decoding circuit separately.

A variable length coding/decoding table unit which can be dynamically restructured The unpack unit which furnishes a bit stream to the table unit at the time of decoding The pack unit which carries out packing of a bit stream, which is outputted from the table unit at the time of coding, in such a way that the bit stream has a memory width A bit stream memory which stores a coded result or a bit stream to be decoded A coefficient memory which stores a decoded result or a coefficient to be coded A control register which stores control information outputted from a CPU A bus I/F which performs I/F with the CPU Furthermore, in this variable length coding and decoding apparatus, the variable length coding/decoding table unit is constructed using cell elements which can be restructured dynamically in order to eliminate the existence of any useless memory area, and table data divided finely are assigned to the cell elements which can be restructured dynamically with the variable length coding/decoding table unit being assumed as a search tree.

The cell elements which can be restructured dynamically are comprised of elements for connection which implement a branched architecture of the search tree, and functional elements which implement nodes of the search tree.

Register groups in which configuration data for implementing the search tree are written (a connection information register group, a bit selection register group, a comparison object register group, and an output value register group) exist in each cell.

[Patent reference 1] JP,2001-308715,A (paragraph numbers [0023] to [0028], and FIG. 1)

[Patent reference 2] JP,2006-101171,A (paragraph numbers [0010] to [0013], and FIG. 1)

A problem with conventional variable length coding and decoding apparatuses which are constructed as mentioned above is that when performing variable length coding or variable length decoding, they have to carry out a process of writing configuration data for implementing a search tree in register groups of each cell (a connection information register group, a bit selection register group, a comparison object register group, and an output value register group), and it is therefore difficult to achieve an improvement in the speed of the variable length coding and in the speed of the variable length decoding.

The present invention is made in order to solve the above-mentioned problems, and it is therefore an object of the present invention to provide a table device which can eliminate the need for performing a process of writing configuration data in a register group of each cell, thereby being able to achieve an improvement in the speed of a variable length coding process and in the speed of a variable length decoding process.

It is another object of the present invention to provide a variable length coding apparatus which implements a table device which can achieve an improvement in the speed of a variable length coding process and in the speed of a variable length decoding process therein, a variable length decoding apparatus which implements the table device therein, and a variable length coding and decoding apparatus which implements the table device therein.

DISCLOSURE OF THE INVENTION

In accordance with the present invention, there is provided a table device including: a plurality of cells to each of which, when receiving a comparison instruction signal, compares a comparison object value thereof with input data and outputs a matching signal when the comparison object value matches the input data; a cell number output means for outputting a cell number indicating a cell which is included in the plurality of cells and which outputs the matching signal; and a node specifying means for specifying a node corresponding to the cell number outputted from the cell number output means from among nodes of a search tree which construct a conversion table, in which a cell control means acquires a data conversion value assigned to the node specified by the node specifying means from a configuration memory, and outputs the data conversion value to outside the table device when the data conversion value is data showing a coded result or a decoded result, or updates a cell to which the cell control means furnishes the comparison instruction signal when the data conversion value is a branch code of the search tree.

Therefore, the table device makes it possible to carry out a variable length coding process and a variable length decoding process without carrying out the writing process of writing configuration data in the register group of each cell. As a result, the present invention offers an advantage of being able to achieve an improvement in the speed of the variable length coding process and in the speed of the variable length decoding process.

BRIEF DESCRIPTION OF THE FIGURES

FIG. 9 is an explanatory drawing showing a variable length coding table;

PREFERRED EMBODIMENTS OF THE INVENTION

Hereafter, in order to explain this invention in greater detail, the preferred embodiments of the present invention will be described with reference to the accompanying drawings.

Embodiment 1

Figure 1:
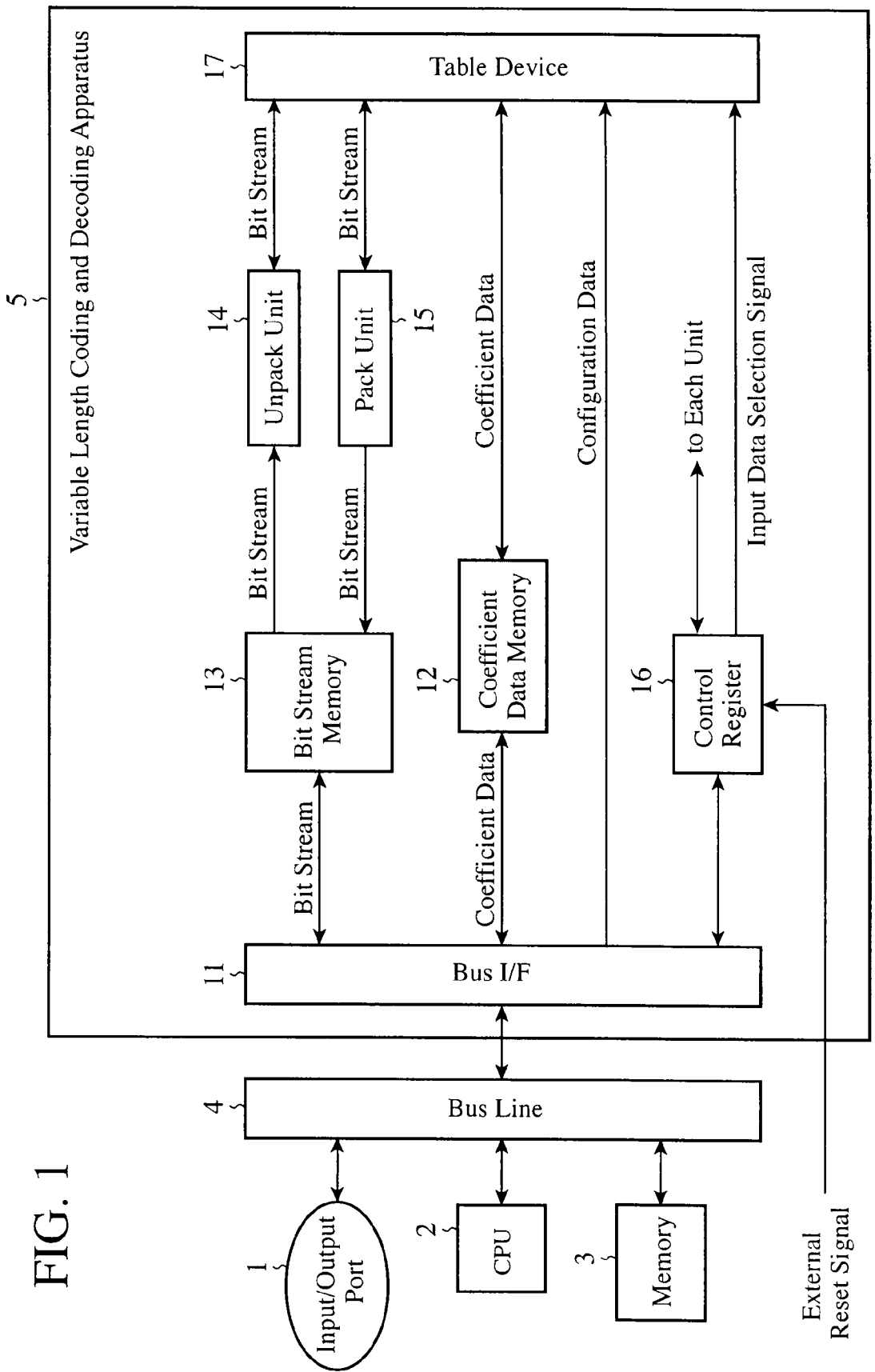
FIG. 1 is a block diagram showing a variable length coding decoding apparatus in accordance with Embodiment 1 of the present invention.

FIG. 1 is a block diagram showing a variable length coding and decoding apparatus in accordance with Embodiment 1 of the present invention. In the figure, an input/output port 1 inputs coefficient data which are image data to be variable length coded in response to an instruction from a CPU (Central Processing Unit) 2 and then outputs the coefficient data to the variable length coding and decoding apparatus 5, and also outputs a bit stream coded by the variable length coding and decoding apparatus 5 when the variable length coding and decoding apparatus carries out variable length coding, while the input/output port 1 inputs a bit stream to be variable length decoded and then outputs the bit stream to the variable length coding and decoding apparatus 5, and also outputs coefficient data decoded by the variable length coding and decoding apparatus 5 when the variable length coding and decoding apparatus carries out variable length decoding.

The CPU 2 controls each constitution unit, and also performs steps except a variable length coding step of a coding process of coding a moving image, and steps except a variable length decoding step of a decoding process of decoding moving image.

A memory 3 is an area for storing a command which the CPU 2 will process, configuration data indicating conversion tables for variable length coding or variable length decoding each of which is constructed in the form of a search tree (variable length coding tables or variable length decoding tables), and so on.

A bus line 4 is a path which is used for transfer of data among the input/output port 1, the CPU 2, the memory 3, and the variable length coding and decoding apparatus 5.

A bus I/F 11 is an interface with the bus line 4 and carries out, for example, a process of capturing the configuration data indicating the conversion tables for variable length coding or variable length decoding (the variable length coding tables or the variable length decoding tables) from the memory 3, and outputting the configuration data to a table device 17 according to an instruction from the CPU 2. The bus I/F 11 constructs a conversion table output means.

A coefficient data memory 12 stores coefficient data which are to be provided to the table device 17 and are to be variable length coded when the variable length coding and decoding apparatus 5 carries out variable length coding, while the coefficient data memory 12 stores coefficient data (data conversion value) which are decoded data outputted from the table device 17 when the variable length coding decoding apparatus 5 carries out variable length decoding. The coefficient data memory 12 constructs a coefficient data storing means.

A bit stream memory 13 stores a bit stream which is packed in data in units of bits by the pack unit 15 when the variable length coding and decoding apparatus 5 carries out variable length coding, while the bit stream memory 13 stores a bit stream which is to be provided to the table device 17 and is to be variable length decoded when the variable length coding decoding apparatus 5 carries out variable length decoding. The bit stream memory 13 constructs a bit stream storing means.

An unpack unit 14 carries out a process of reading a bit stream from the bit stream memory 13 in units of bits, and outputting a fixed-length bit stream to the table device 17. The unpack unit 14 constructs a bit stream output means.

A pack unit 15 carries out a process of packing a bit stream of variable length codes (a data conversion value) which is coded data outputted from the table device 17 in data in units of bits, and stores them in the bit stream memory 13. The pack unit 15 constructs a packing means.

When receiving an external reset signal, the control register 16 is reset and, in response to an instruction from the CPU 2, outputs an input data selection signal which is used for selection of input data (coefficient data or a bit stream) to be provided to the table device 17 at the time of performing the variable length coding or the variable length decoding to the table device 17, and also outputs a table number specifying a conversion table (a variable length coding table or a variable length decoding table) which the table device 17 uses, a page number which the table device 17 uses at the time of the start of a comparison operation, and an initial code specifying a cell group which is made to perform the comparison process to the table device 17.

The able device 17 carries out the variable length coding process or the variable length decoding process.

Figure 2:
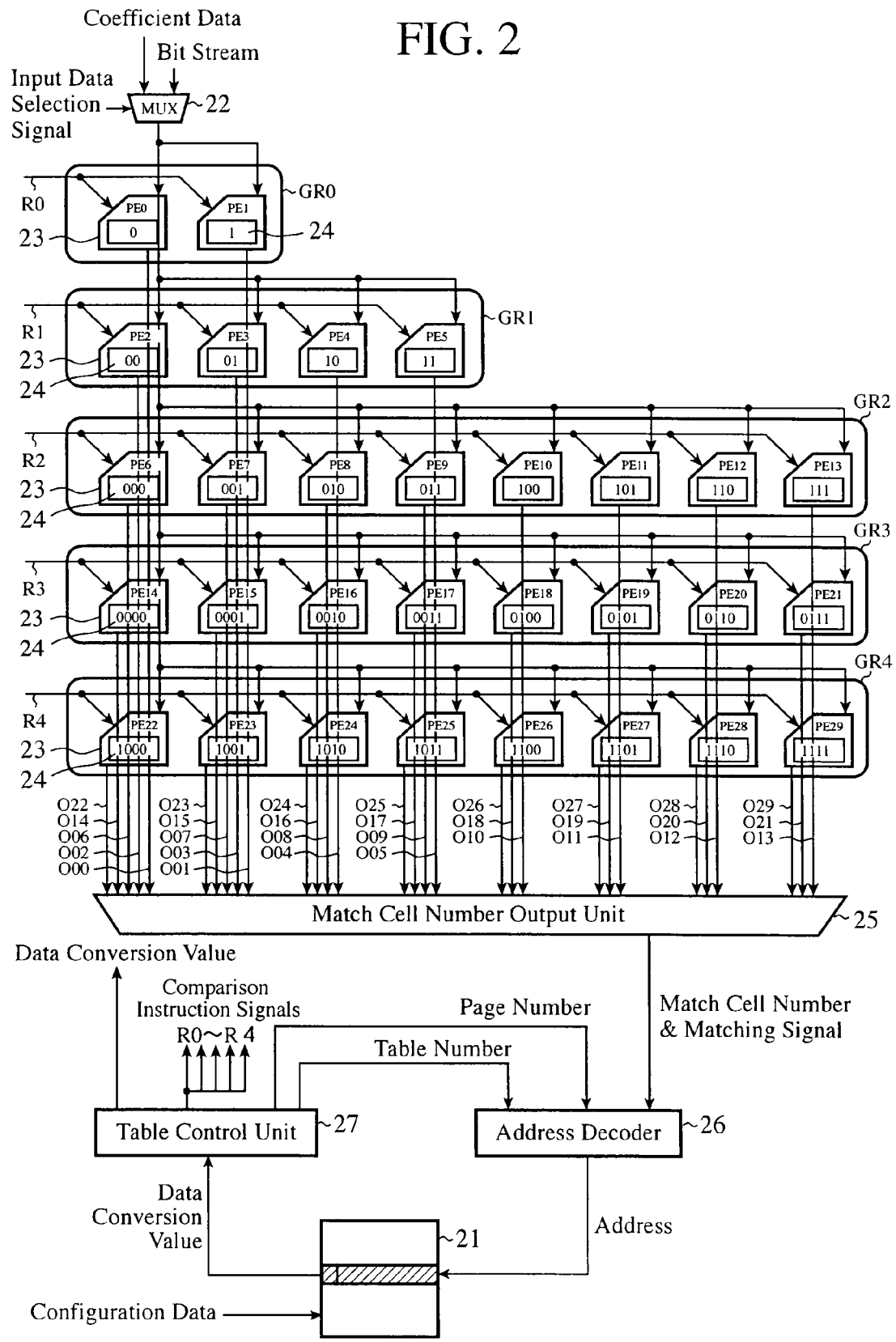
FIG. 2 is a block diagram showing a table device in accordance with Embodiment 1 of the present invention.

FIG. 2 is a block diagram showing the table device 17 in accordance with Embodiment 1 of the present invention. In the figure, a configuration memory 21 holds the configuration data outputted from the bus I/F 11.

A multiplexer (in FIG. 2, referred to as "MUX") 22 carries out a process of selecting either the coefficient data outputted from the coefficient data memory 12 or the bit stream outputted from the unpack unit 14 according to the input data selection signal outputted from the control register 16, and outputting either the coefficient data or the bit stream to cells 23 (referred to as "cells PE0 to PE29" from here on).

Each of the cells PE0 to PE29 is provided with a comparator 24 to which a specific comparison object value is assigned, and carries out a process of comparing the specific comparison object value with the coefficient data or the bit stream outputted from the multiplexer 22 when receiving a comparison instruction signal from a table control unit 27, and outputting a corresponding one of matching signals O00 to O29 when its comparison object value matches the coefficient data or the bit stream.

The cells PE0 to PE29 are divided into cell groups in such a way that cells whose comparison object values assigned thereto have the same number of bits are included in the same group. More specifically, the cells PE0 and PE1 having comparison object values whose number of bits is 1 are grouped into the cell group GR0, the cells PE2 to PE5 having comparison object values whose number of bits is 2 are grouped into the cell group GR1, and the cells PE6 and PE13 having comparison object values whose number of bits is 3 are grouped into the cell group GR2.

Furthermore, the cells PE14 to PE21 having comparison object values whose number of bits is 4 are grouped into the cell group GR3, and the cells PE22 and PE29 having comparison object values whose number of bits is 4 are grouped into the cell group GR4.

A match cell number output unit 25 carries out a process of outputting a match cell number showing a cell PE which has outputted a corresponding one of matching signals O00 to O29 among the cells PE0 to PE29 to an address decoder 26. The match cell number output unit 25 constructs a cell number output means.

The address decoder 26 carries out a process of specifying a node corresponding to a match cell number outputted from the match cell number output unit 25 from among the nodes of the search tree which constructs the conversion table specified by the table number outputted from the table control unit 27, the conversion table being included in the conversion tables (the variable length coding tables and the variable length decoding tables) indicated by the configuration data stored in the configuration memory 21, and generating an address in the configuration memory 21 at which a data conversion value assigned to the node (a bit stream, coefficient data, or a branch code of the search tree) is stored. The address decoder 26 constructs a node specifying means.

The table control unit 27 acquires the data conversion value stored at the address generated by the address decoder from among the data conversion values stored in the configuration memory 21, and, when the data conversion value is a bit stream of variable length codes, outputs the bit stream to the pack unit 15, outputs the data conversion value to the coefficient data memory 12 when the data conversion value is coefficient data, or, when the data conversion value is a branch code of the search tree, acquires a specification code specifying a cell group GR to which the table control unit furnishes the comparison instruction signal R the next time from the branch code to update the cell group GR to which the table control unit furnishes the comparison instruction signal R. The table control unit 27 constructs a cell control means.

Figures 3, 4:
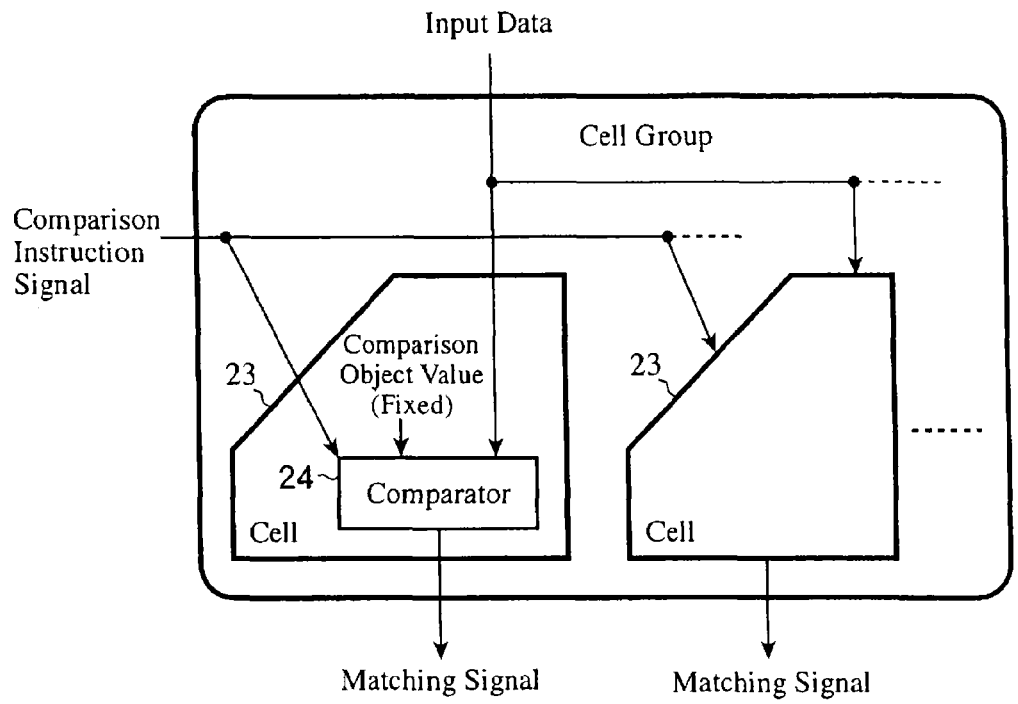
FIG. 3 is a block diagram showing an example of the configuration of cell groups GR0 to GR4.
FIG. 4 is an explanatory drawing showing a variable length decoding table.

FIG. 3 is a block diagram showing an example of the configuration of the cell groups GR0 to GR4.

Each of the cells PE0 to PE29 is provided with a comparator 24, and a specific comparison object value (a fixed value) is assigned to the comparator 24.

The comparator 24 compares the specific comparison object value with the input data selected by the multiplexer 22, and outputs a matching signal O when they match each other.

The number of bits of the specific comparison object value in each cell PE is decided for each of the cell groups GR0 to GR4. For example, the comparison object values of the cells PE0 and PE1 of the cell group GR0 have 1 bit, and the comparison object value of the cell PE0 is "0" and the comparison object value of the cell PE1 is "1".

The comparison object values of the cells PE2 to PE5 of the cell group GR1 have 2 bits, and the comparison object value of the cell PE2 is "00", the comparison object value of the cell PE3 is "01", the comparison object value of the cell PE4 is "10", and the comparison object value of the cell PE5 is "11".

The comparison object values of the cells PE6 to PE13 of the cell group GR2 have 3 bits, and the comparison object value of the cell PE6 is "000", the comparison object value of the cell PE7 is "001", the comparison object value of the cell PE8 is "010", the comparison object value of the cell PE9 is "011", the comparison object value of the cell PE10 is "100", the comparison object value of the cell PE13 is "101", the comparison object value of the cell PE12 is "110", and the comparison object value of the cell PE13 is "111".

The comparison object values of the cells PE14 to PE21 of the cell group GR3 have 4 bits, and the comparison object value of the cell PE14 is "0000", the comparison object value of the cell PE15 is "0001", the comparison object value of the cell PE16 is "0010", the comparison object value of the cell PE17 is "0011", the comparison object value of the cell PE18 is "0100", the comparison object value of the cell PE19 is "0101", the comparison object value of the cell PE20 is "0110", and the comparison object value of the cell PE21 is "0111".

The comparison object values of the cells PE22 to PE29 of the cell group GR4 have 4 bits, and the comparison object value of the cell PE22 is "1000", the comparison object value of the cell PE23 is "1001", the comparison object value of the cell PE24 is "1010", the comparison object value of the cell PE25 is "1011", the comparison object value of the cell PE26 is "1100", the comparison object value of the cell PE27 is "1101", the comparison object value of the cell PE28 is "1110", and the comparison object value of the cell PE29 is "1111".

Each of the cell groups GR0 to GR4 receives only a portion of the input data selected by the multiplexer 22, the portion having the same number of bits, counted from the leading bit of the input data, as the comparison object values of the cells PE which belong to each of the cell groups GR0 to GR4.

In this case, the comparison object value of each cell indicates a bit stream separated into units of an arbitrary bit length which are referred to in the variable length decoding table at the time of variable length decoding, and indicates a direct transformation coefficient quantized which are referred to in the variable length coding table at the time of variable length coding. For example, in the case of an MPEG system, this orthogonal transformation coefficient corresponds to a DCT coefficient.

Next, the operation of the variable length coding and decoding apparatus will be explained.

First, the configuration will be explained.

The configuration means a setup of the description of data conversion corresponding to each variable length coding/decoding method in the configuration memory 21 of the table device 17 so as to form a variable length coding table or a variable length decoding table.

Figure 5:
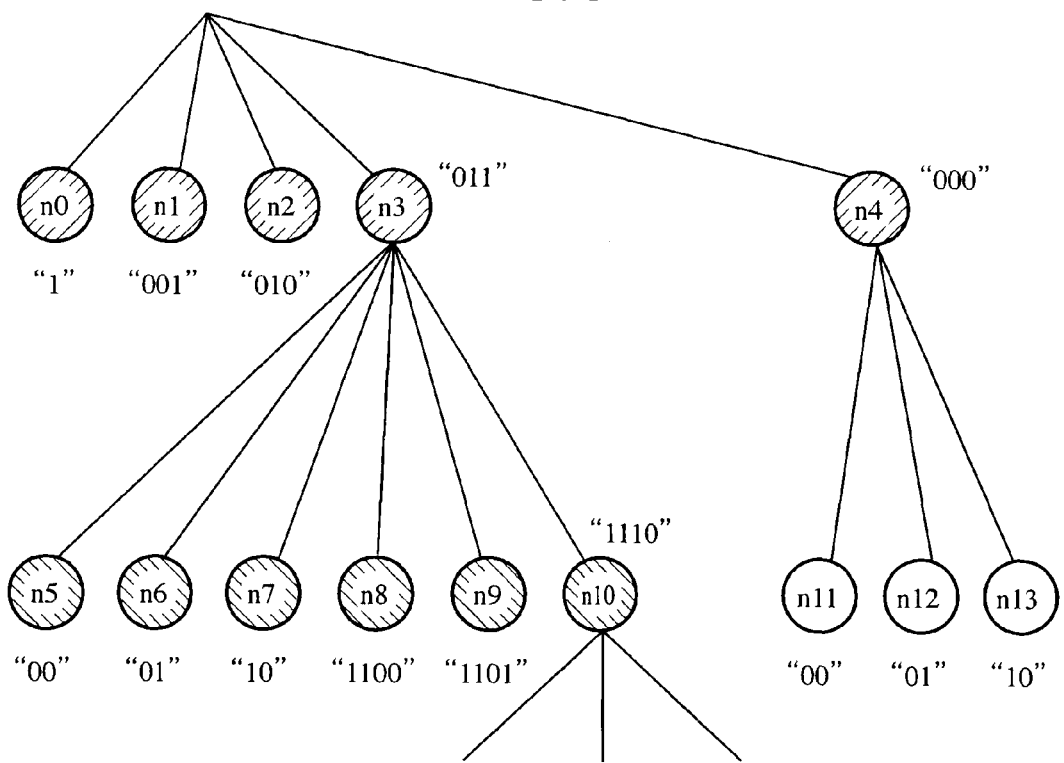
FIG. 5 is an explanatory drawing showing a search tree which constructs the variable length decoding table.

Configuration data include this description of data conversion. Concretely, the configuration data include a bit stream which is a data conversion value showing variable length coding results, coefficient data which are a data conversion value showing the variable length decoding results, and a branch code of a search tree (the branch code is data used for reconstructing cells PE, and include a specification code showing a cell group to which the table control unit furnishes the comparison instruction signal R the next time, and a page number which is used the next time (when a table as shown in FIG. 5 is divided into units of a certain number of bits or less and this table is assumed to be a search tree, each set of subtrees which can be compared simultaneously is a "page" and a "page number" is information specifying a page to which a subtree to be compared belongs).

When receiving either an external reset signal from outside the apparatus or a software reset signal which is generated through a setup of the control register 16, for example, immediately after the variable length coding and decoding apparatus 5 is powered on, the variable length coding and decoding apparatus 5 is reset.

After the variable length coding and decoding apparatus is reset, each of the unpack unit 14, the pack unit 15, and the table device 17 of the variable length coding and decoding apparatus 5 enters an initial state and holds its initial state until receiving a start instruction from the CPU 2.

After started, the CPU 2 transmits the configuration data corresponding to the variable length coding or the variable length decoding stored in the memory 3 to the configuration memory 21 of the table device 17 by controlling the bus I/F 11 as an initializing operation.

When the configuration data are stored in the configuration memory 21, the table device 17 is set to a state in which the table device 17 can operate as the variable length coding table or the variable length decoding table.

Hereafter, a mapping method of mapping the configuration data indicating the variable length decoding table of FIG. 4 will be explained.

The table device 17 of FIG. 2 can carry out a comparison of up to four bits at a time. When the variable length coding table or the variable length decoding table is constructed in such a way as to require a larger number of bits than four bits, the whole table is implemented by changing the page number dynamically, as will be mentioned below. In order to suppress increase in the number of bits of the page number inputted to the address decoder 26, the maximum of the page number is made as small as possible. More specifically, the mapping is carried out in such a way that a maximum number of subtrees having different roots in the search tree are packed in the same page.

Because the number of bits of the specific comparison object value assigned to each of the cells PE0 to PE29 which construct the table device 17 is 1, 2, 3, or 4, each variable length code of the variable length decoding table of FIG. 4 is divided into units of one to four bits, and a search tree as shown in FIG. 5 is generated.

A comparison object bit pattern in each of nodes n0 to n13 of the search tree which are points to be compared (for example, in the case of the node n3, "011") is compared with an input bit sequence (a bit string of the input data selected by the multiplexer 22), and, when the comparison object bit pattern matches the input bit sequence, a comparison object bit pattern in each child node connected to the node (e.g., the child nodes of the node n3 are nodes n5 to n10) is compared with a subsequent input bit sequence.

Figure 6:
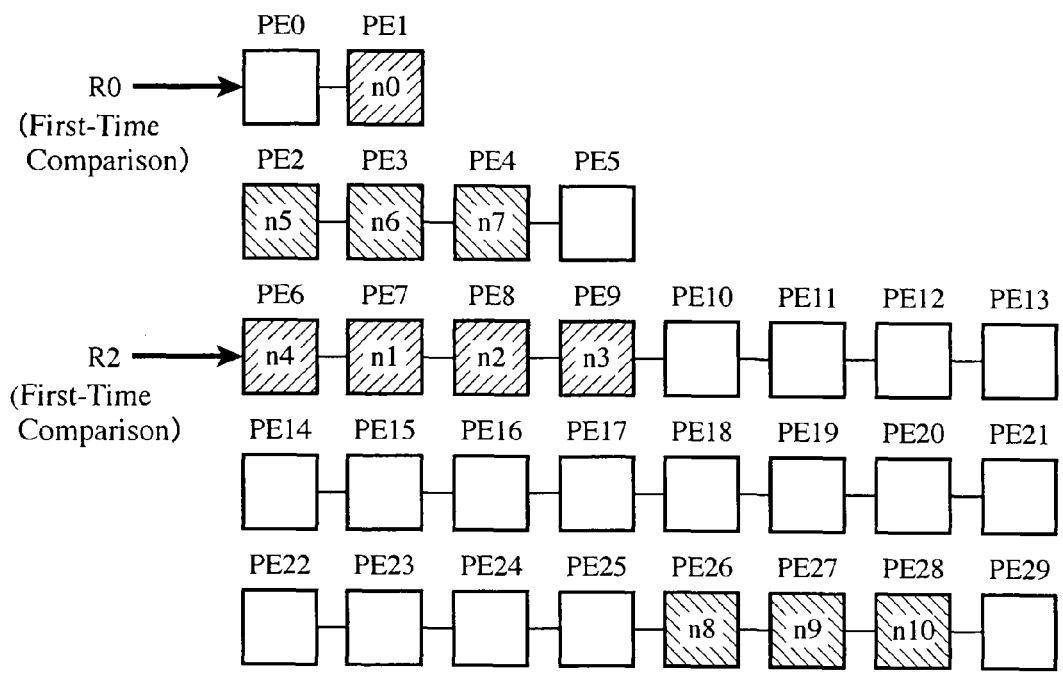
FIG. 6 is an explanatory drawing showing a state in which nodes n0 to n13 of FIG. 5 are mapped to cells PE of the table device 17 of FIG. 2.

FIG. 6 is an explanatory drawing showing a state in which the nodes n0 to n13 of FIG. 5 are mapped respectively to the cells PE of the table device 17 of FIG. 2.

In the example of FIG. 6, the nodes n0 to n13 are mapped respectively to cells PE of the table device 17 as follows.

Node n0→cell PE1
Node n5→cell PE2
Node n6→cell PE3
Node n7→cell PE4
Node n4→cell PE6
Node n1→cell PE7
Node n2→cell PE8
Node n3→cell PE9

Node n8→cell PE26
Node n9→cell PE27
Node n10→cell PE28

Because the comparison object bit patterns of the nodes n11 to n13 are the same as those of the nodes n5 to n7, respectively, they are mapped to the cells PE2 to PE4 of another page, respectively.

Because the subtree comprised of the nodes n0-n4 and the subtree comprised of the node n5 to n10 are the ones having different roots while all of the comparison object values assigned to these nodes do not coincide with one another, the nodes can be mapped to the same page.

In a first-time comparison process, the table control unit 27 outputs the comparison instruction signals R0 and R2 to the cell groups GR0 and GR2, respectively (the output of the comparison instruction signals R0 and R2 follows the initial code outputted from the control register 16), the cells PE0 and PE1 of the cell group GR0, and the cells PE6 to PE13 of the cell group GR2 perform comparison of their respective specific comparison object values with the input bit sequence.

For example, even when the result of the comparison process by the cell PE6 shows that its specific comparison object value matches the input bit sequence, the matching is not completed because the nodes n11 to n13 are connected to the node n4 mapped to the cell PE6.

Because the subtree comprised of the nodes n11 to n13 is mapped to the cells PE2 to PE4 of another page, as mentioned above, the table control unit outputs a page number indicating the other page to the address decoder 26 and also outputs the comparison instruction signal R1 to the cell group GR1 to which the cells PE2 to PE4 belong so as to reconstruct the table.

Furthermore, although also when the result of the comparison process by the cell PE9 shows that its specific comparison object value matches the input bit sequence, the matching is not completed, the table control unit does not change the page number because the nodes n5 to n10 connected to the node n3 mapped to the cell PE9 are mapped to the same page as the node n3.

In this case, the table control unit outputs the comparison instruction signals R1 and R4 to the cell group GR1 to which the cells PE2 to PE4 belong and to the cell group GR4 to which the cells PE26 to PE28 belong, respectively, the nodes n5 to n10 being mapped to the cells PE2 to PE4 and PE26 to PE28, respectively, so as to reconstruct the table.

When the reconstruction of the table, as mentioned above, is completed, the table device starts a second-time comparison process. By thus packing different subtrees in the same page, the table device can reduce the maximum of the page number and can also reduce the number of bits of the page number to be outputted to the address decoder 26, compared with a case in which different subtrees are mapped to different pages, respectively.

Figure 7:
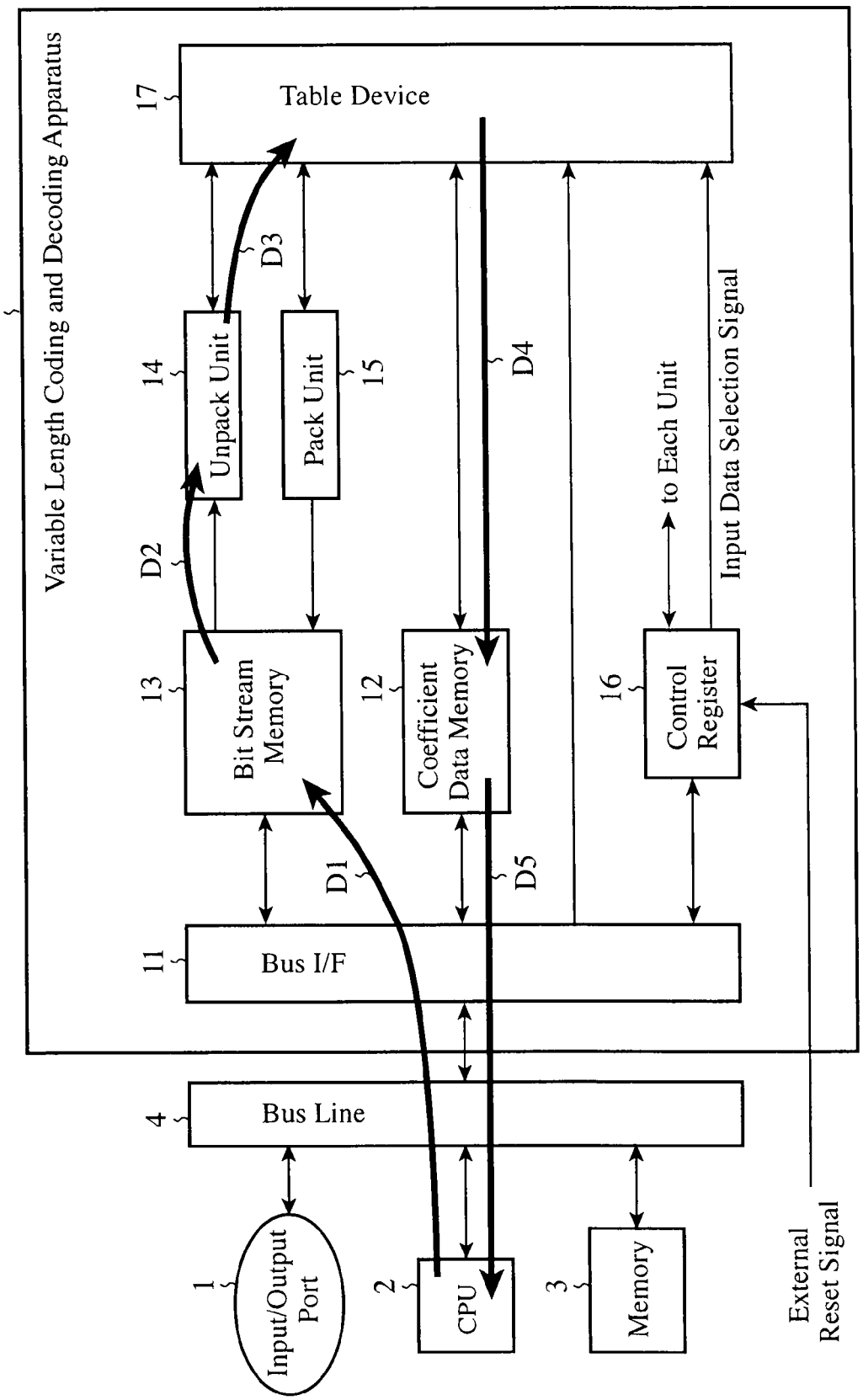
FIG. 7 is an explanatory drawing showing an example of a variable length decoding operation.

Next, an example of the variable length decoding operation will be explained concretely. FIG. 7 is an explanatory drawing showing the example of the variable length decoding operation.

The CPU 2 controls the bus I/F 11, as mentioned above, so as to transmit the configuration data corresponding to the variable length decoding, which are stored in the memory 3, to the configuration memory 21 of the table device 17.

When the configuration data are stored in the configuration memory 21, the table device 17 is set to a state in which the table device 17 can operate as the variable length decoding table.

The CPU 2 accepts a bit stream to be variable length decoded from the input/output port 1, and stores a portion of the bit stream corresponding to block data about one macro block in the bit stream memory 13 via the bus line 4 and the bus I/F 11 (an arrow D1).

When the CPU 2 stores the bit stream in the bit stream memory 13, the CPU 2 writes a decoding start signal for instructing a start of the decoding of the bit stream in a decoding start instruction register included in the control register 16, and outputs an input data selection signal for instructing a selection of the bit stream to the multiplexer 22 of the table device 17.

When the CPU 2 stores the bit stream in the bit stream memory 13, the unpack unit 14 reads the bit stream from the bit stream memory 13 in units of a specific number of bits (an arrow D2), and shifts the bit stream according to a shift value specified by the CPU 2 or the table device 17 to output an always-effective bit stream having a specific number of bits to the multiplexer 22 of the table device 17 (an arrow D3).

When the decoding start signal is written in the decoding start instruction register included in the control register 16, the table device 17 reads a bit stream having a specific number of bits from the unpack unit 14, carries out the variable length decoding according to the bit stream and outputs coefficient data about a fixed length code which are the variable length decoding results to the coefficient data memory 12 (an arrow D4), and, when clearing the number of times that the table is used, simultaneously provides a notification to the CPU 2 with an interrupt signal.

When receiving the interrupt signal from the table device 17, the CPU 2 reads the coefficient data which are the variable length decoding results, via the bus I/F 11, from the coefficient data memory 12 (an arrow D5).

Hereafter, the variable length decoding process performed by the table device 17 will be explained concretely.

Figure 8:
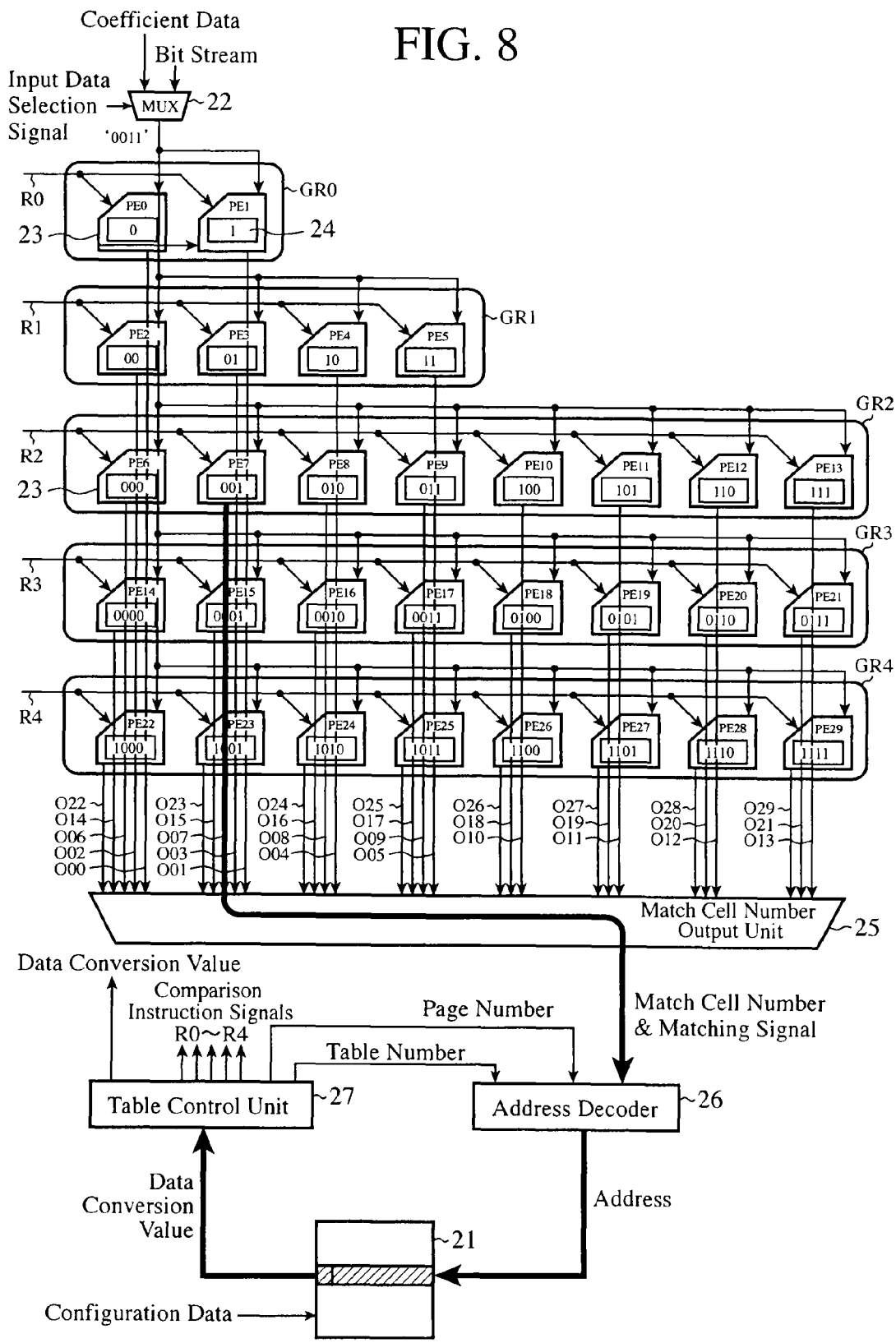
FIG. 8 is an explanatory drawing showing the variable length decoding process performed by the table device 17.

Hereafter, for the sake of convenience in explanation, it is assumed that the configuration data showing the variable length decoding table shown in FIGS. 4 and 5 are stored in the configuration memory 21, and a bit stream having a specific number of bits which is inputted to the multiplexer 22 is "0011." FIG. 8 is an explanatory drawing showing the variable length decoding process performed by the table device 17.

The multiplexer 22 of the table device 17 selects the bit stream "0011" outputted from the unpack unit 14 according to the input data selection signal outputted from the control register 16 in response to an instruction from the CPU 2, and outputs the bit stream "0011" to the cells PE0 to PE29.

Each of the cells PE0 to PE29 accepts only a portion of the bit stream "0011" outputted from the multiplexer 22, the portion having one or more bits whose number is the same as the number of bits of its comparison object value, and which are counted from the leading bit of the bit stream "0011".

More specifically, each of the cells PE0 and PE1 whose comparison object value consists of one bit accepts "0", each of the cells PE2 to PE5 whose comparison object value consists of two bits accepts "00", each of the cells PE6 and PE13 whose comparison object value consists of three bits accepts "001", and each of the cells PE14 and PE29 whose comparison object value consists of four bits accepts "0011."

When the decoding start signal is written in the decoding start instruction register included in the control register 16, the table control unit 27 acquires, from the control register 16, the table number specifying the variable length decoding table of FIGS. 4 and 5, the page number which is used at the time of start of the comparison operation (typically, the number of the page to which the subtree including the root node of the search tree is mapped), and the initial code specifying the cell groups GR0 and GR2 which are made to carry out the comparison process.

The table control unit 27 outputs both the table number specifying the variable length decoding table of FIGS. 4 and 5 and the page number which is used at the time of start of the comparison operation to the address decoder 26, and outputs the comparison instruction signals R0 and R2 to the cell groups GR0 and GR2, respectively.

When receiving the comparison instruction signals R0 and R2 from the table control unit 27, the cells PE0 and PE1 which belong to the cell group GR0, and the cells PE6 to PE13 which belong to the cell group GR2 perform comparison of their respective specific comparison object values with the bit sequence inputted thereto from the multiplexer 22.

More specifically, the cells PE0 and PE1, and PE6 to PE13 carry out the following comparison processes, respectively.

| | Comparison object value | Input bit sequence | Comparison result |
|---|---|---|---|
| Cell PE0 | 0 | 0 | Match |
| Cell PE1 | 1 | 0 | Mismatch |
| Cell PE6 | 000 | 001 | Mismatch |
| Cell PE7 | 001 | 001 | Match |
| Cell PE8 | 010 | 001 | Mismatch |
| Cell PE9 | 011 | 001 | Mismatch |
| Cell PE10 | 100 | 001 | Mismatch |
| Cell PE11 | 101 | 001 | Mismatch |
| Cell PE12 | 110 | 001 | Mismatch |
| Cell PE13 | 111 | 001 | Mismatch |

In this case, because the results of the comparison processes performed by the cells PE0 and PE7 show a match, a matching signal O00 is outputted from the cell PE0 and a matching signal O07 is outputted from the cell PE7.

When receiving one of matching signals O00 to O29 from a corresponding one of the cells PE0 to PE29, the match cell number output unit 25 outputs a matching signal which shows that there exists a cell PE which provides a comparison process result showing a match to the address decoder 26, and further outputs a match cell number showing the cell PE, among the cells PE0 to PE29, which has outputted the one of the matching signals O00 to O29 to the address decoder 26.

When simultaneously receiving matching signals O from a plurality of cells PE, the match cell number output unit outputs a larger one of the cell numbers respectively showing the cells by giving higher priority to it in a case in which, for example, cell numbers are given to the cells PE0 to PE29 in such a way that the smaller number of bits the specific comparison object value of a cell has the smaller cell number is assigned to the cell.

Therefore, when receiving the matching signals O00 and O07 from the cells PE0 and PE7 simultaneously, as mentioned above, the match cell number output unit outputs the match cell number showing the cell PE7 to which a larger cell number is assigned to the address decoder 26.

When receiving the matching signal and the match cell number from the match cell number output unit 25, the address decoder 26 specifies the node corresponding to the match cell number (the node n1 mapped to the cell PE7) from among the nodes of the subtree which is included in the search tree which constructs the conversion table (the variable length decoding table shown in FIGS. 4 and 5) specified by the table number outputted from the table control unit 27, and which is mapped to the page specified by the page number outputted from the table control unit 27.

After specifying the node n1 corresponding to the match cell number, the address decoder 26 generates an address in the configuration memory 21 in which the data conversion value (coefficient data or a branch code of the search tree) assigned to the node n1 is stored.

The table control unit 27 acquires the data conversion value stored at the address generated by the address decoder from among the data conversion values stored in the configuration memory 21.

When the acquired data conversion value is coefficient data, the table control unit 27 outputs the data conversion value to the coefficient data memory 12, whereas when the data conversion value is a branch code of the search tree, the table control unit 27 acquires both a specification code indicating the cell group GR to which the table control unit furnishes the comparison instruction signal R the next time and a page number which is used the next time from the branch code, and updates the cell group GR to which the table control unit furnishes the comparison instruction signal R.

Because the node n1 is a terminal node as shown in FIG. 5, a data conversion value (an orthogonal transformation coefficient) which is coefficient data "3" of a fixed length code is assigned to the node n1, and the table control unit 27 outputs the coefficient data "3" to the coefficient data memory 12.

Previously, the case in which the bit stream having a specific number of bits inputted to the multiplexer 22 is "0011" is shown. In contrast, in an example in which the bit stream having a specific number of bits is "0001", the cells PE whose comparison process results show a match are the ones PE0 and PE6.

In this case, the match cell number output unit 25 receives matching signals O00 and O06 from the cells PE0 and PE6 simultaneously, and outputs the match cell number indicating the cell PE6 to which a larger cell number is assigned to the address decoder 26.

When receiving the match cell number indicating the cell PE6 from the match cell number output unit 25, the address decoder 26 specifies the node corresponding to the match cell number (the node n4 mapped to the cell PE6) from among the nodes of the subtree which is included in the search tree which constructs the conversion table (the variable length decoding table shown in FIGS. 4 and 5) specified by the table number outputted from the table control unit 27, and which is mapped to the page specified by the page number outputted from the table control unit 27.

After specifying the node n4 corresponding to the match cell number, the address decoder 26 generates an address in the configuration memory 21 in which the data conversion value (coefficient data or a branch code of the search tree) assigned to the node n4 is stored.

The table control unit 27 acquires the data conversion value stored at the address generated by the address decoder from among the data conversion values stored in the configuration memory 21.

When the data conversion value is coefficient data, the table control unit 27 outputs the data conversion value to the coefficient data memory 12, whereas when the data conversion value is a branch code of the search tree, the table control unit 27 acquires both a specification code indicating the cell group GR to which the table control unit furnishes the comparison instruction signal R the next time and a page number which is used the next time from the branch code, and updates the cell group GR to which the table control unit furnishes the comparison instruction signal R.

Because the node n4 is a branch node as shown in FIG. 5, a branch code of the search tree is assigned to the node n4, the table control unit 27 acquires a specification code indicating the cell group GR to which the table control unit furnishes the comparison instruction signal R the next time from this branch code to update the cell group GR to which the table control unit furnishes the comparison instruction signal R.

More specifically, because the subtree comprised of the nodes n11 to n13 connected to the node n4 is mapped to the cells PE2 to PE4 of another page, as mentioned above, the table control unit 27 outputs the page number showing the other page to the address decoder 26.

The table control unit 27 also outputs the comparison instruction signal R1 to the cell group GR1 to which the cells PE2 to PE4 belong so as to reconstruct the variable length decoding table.

As a result, when each of the cells PE2 to PE5 belonging to the cell group GR1 receives the comparison instruction signal R1, each of the cells PE2 to PE5 compares a portion, at a branch point and lower points (lower bits than "000"), of the input bit sequence with the specific comparison object value.

More specifically, each of the cells PE2 to PE5 belonging to the cell group GR1 accepts the portion, at the branch point and lower points (lower bits than "000"), of the input bit sequence from the multiplexer 22, and performs a second-time comparison process on the portion. Because the second-time comparison process itself is the same as the first-time comparison process, the detailed explanation of the second-time comparison process will be omitted hereafter.

Previously, the case in which the bit stream having a specific number of bits inputted to the multiplexer 22 is "0011" and the case in which the bit stream having a specific number of bits inputted to the multiplexer 22 is "0001" are shown. In contrast, in an example in which the bit stream having a specific number of bits is "0110", the cells PE whose comparison processing results show a match are the ones PE0 and PE9.

In this case, the match cell number output unit 25 receives matching signals O00 and O09 from the cells PE0 and PE9 simultaneously, and outputs the match cell number indicating the cell PE9 to which a larger cell number is assigned to the address decoder 26.

When receiving the match cell number indicating the cell PE9 from the match cell number output unit 25, the address decoder 26 specifies the node corresponding to the match cell number (the node n3 mapped to the cell PE9) from among the nodes of the subtree which is included in the search tree which constructs the conversion table (the variable length decoding table shown in FIGS. 4 and 5) specified by the table number outputted from the table control unit 27, and which is mapped to the page specified by the page number outputted from the table control unit 27.

After specifying the node n3 corresponding to the match cell number, the address decoder 26 generates an address in the configuration memory 21 in which the data conversion value (coefficient data or a branch code of the search tree) assigned to the node n3 is stored.

The table control unit 27 acquires the data conversion value stored at the address generated by the address decoder 26 from among the data conversion values stored in the configuration memory 21.

When the data conversion value is coefficient data, the table control unit 27 outputs the data conversion value to the coefficient data memory 12, whereas when the data conversion value is a branch code of the search tree, the table control unit 27 acquires both a specification code indicating the cell group GR to which the table control unit furnishes the comparison instruction signal R the next time and a page number which is used the next time from the branch code to update the cell group GR to which the table control unit furnishes the comparison instruction signal R.

Because the node n3 is a branch node as shown in FIG. 5, a branch code of the search tree is assigned to the node n3, the table control unit 27 acquires a specification code indicating the cell group GR to which the table control unit furnishes the comparison instruction signal R the next time from this branch code to update the cell group GR to which the table control unit furnishes the comparison instruction signal R.

More specifically, because the subtree comprised of the nodes n5 to n10 connected to the node n3 is mapped to the same page as that to which the node n3 is mapped, the table control unit 27 does not change the page number, but outputs the comparison instruction signals R1 and R4 to the cell group GR1 to which the cells PE2 to PE4 belong and to the cell group GR4 to which the cells PE26 to PE28 belong, respectively, the nodes n5 to n20 being respectively mapped to the cells PE2 to PE4 and PE26 to PE28, so as to reconstruct the table.

As a result, when each of the cells PE2 to PE4 belonging to the cell group GR1 and the cells PE26 to PE28 belonging to the cell group GR4 receives the comparison instruction signal R1 or R4, each of the cells PE2 to PE4 and PE26 to PE28 compares a portion, at the branch point and lower points (lower bits than "000"), of the input bit sequence with its specific comparison object value.

More specifically, each of the cells PE2 to PE4 belonging to the cell group GR1 and the cells PE26 to PE28 belonging to the cell group GR4 accepts the portion, at the branch point and lower points (lower bits than "000"), of the input bit sequence from the multiplexer 22, and performs a second-time comparison process on the portion.

Previously, the variable length decoding is explained. The variable length coding can also be carried out by using the same circuit.

In the variable length coding, input data inputted to the table device 17 are coefficient data read from the coefficient data memory 12, and are fixed-length data.

Data outputted to the pack unit 15 from the table device 17 are a bit stream, and are variable length data.

FIG. 9 is an explanatory drawing showing a variable length coding table, and the variable length coding table of FIG. 9 is a portion extracted from a TotalCoeff/TrailingOnes table for use with H.264.

In the variable length coding, a combination of a plurality of values is variable length coded in many cases, and TotalCoeff/TrailingOnes of H.264 and Run/Level of MPEG-2 or MPEG-4 are examples of such a combination.

"TotalCoeff" is 5-bit data which can have a value ranging from 0 to 16 and "TrailingOnes" is 2-bit data which can have a value ranging from 0 to 3, 7-bit fixed length data are provided by placing "TotalCoeff" as five higher-order bits of the data, and placing "TrailingOnes" as two lower-order bits of the data, and the variable length coding process is performed on the 7-bit fixed length data.

Figure 10:
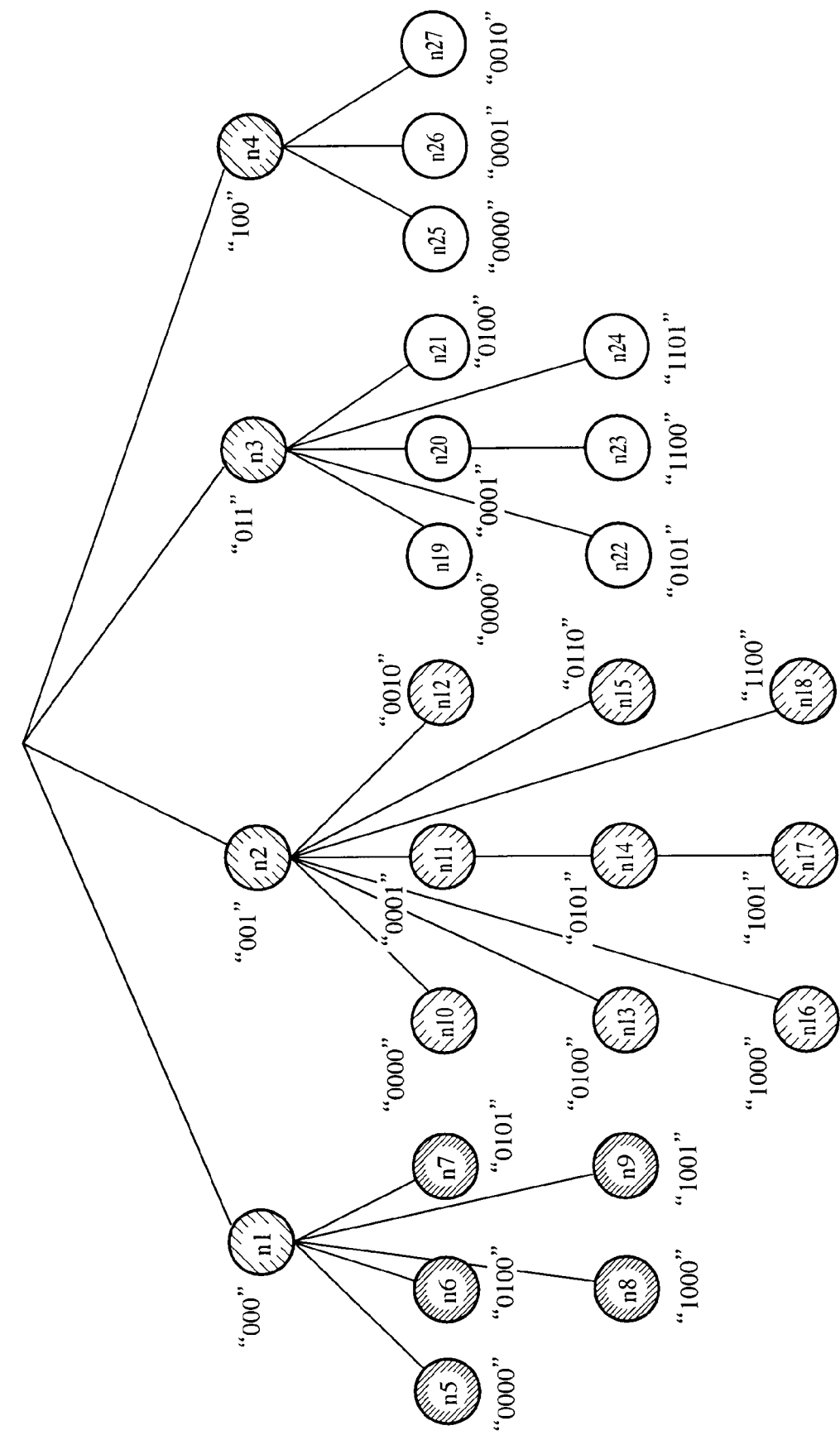
FIG. 10 is an explanatory drawing showing a search tree which constructs the variable length coding table.
Figure 11:
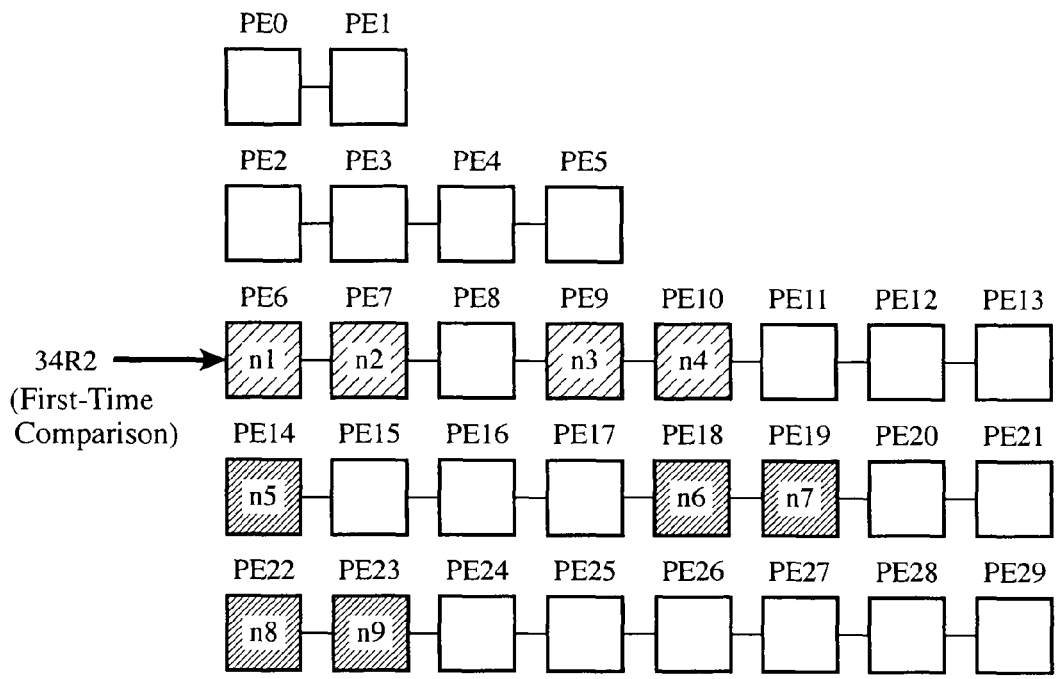
FIG. 11 is an explanatory drawing showing a state in which nodes n1 to n9 of FIG. 10 are mapped to the cells PE of the table device 17 of FIG. 2.
Figure 12:
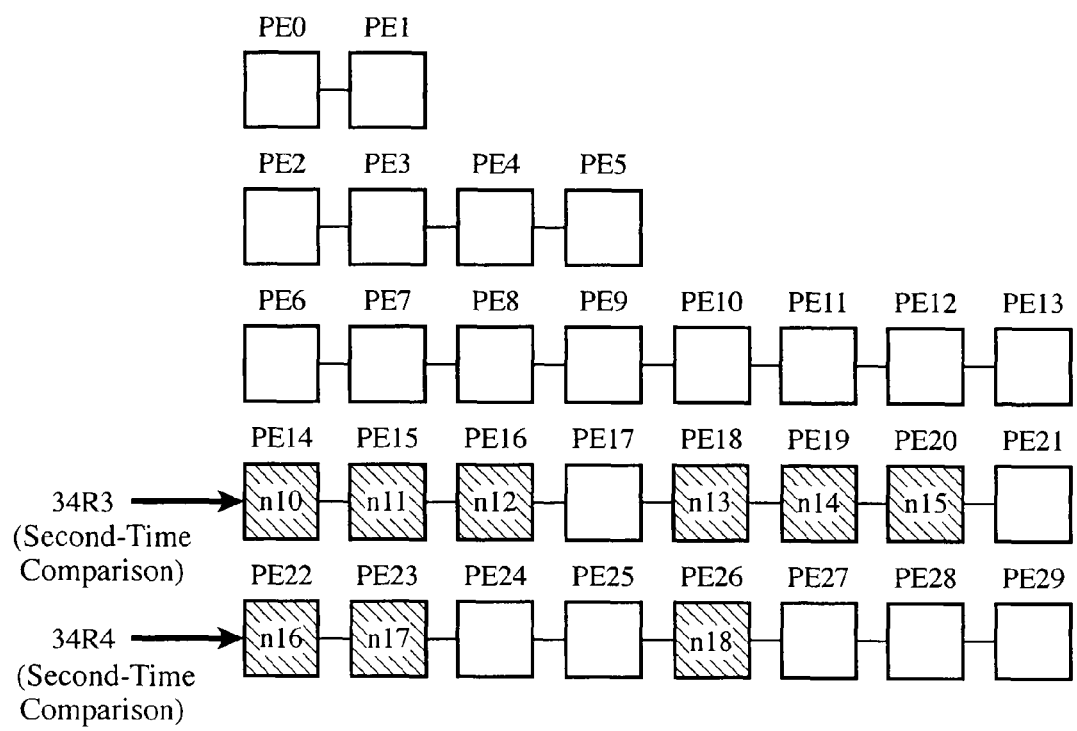
FIG. 12 is an explanatory drawing showing a state in which nodes n10 to n18 of FIG. 10 are mapped to the cells PE of the table device 17 of FIG. 2.

Like in the case in which above-mentioned variable length decoding is carried out, fixed length data are divided into a plurality of data of 4 bits or less so that a search tree is generated (refer to FIG. 10), and the search tree is mapped to cells PE0 to PE29 each of which performs a 1-bit, . . . , or 4-bit comparison (refer to FIGS. 11 and 12).

In the search tree of FIG. 10, even in a case in which either one of the nodes n1 to n4 which perform a comparison for the first time provides a comparison result showing a match, all subtrees which perform a subsequent comparison consist of 4-bit nodes.

In this case, because a plurality of subtrees cannot be mapped to the same page, they are mapped to different pages as shown in FIGS. 11 and 12.

Figure 13:
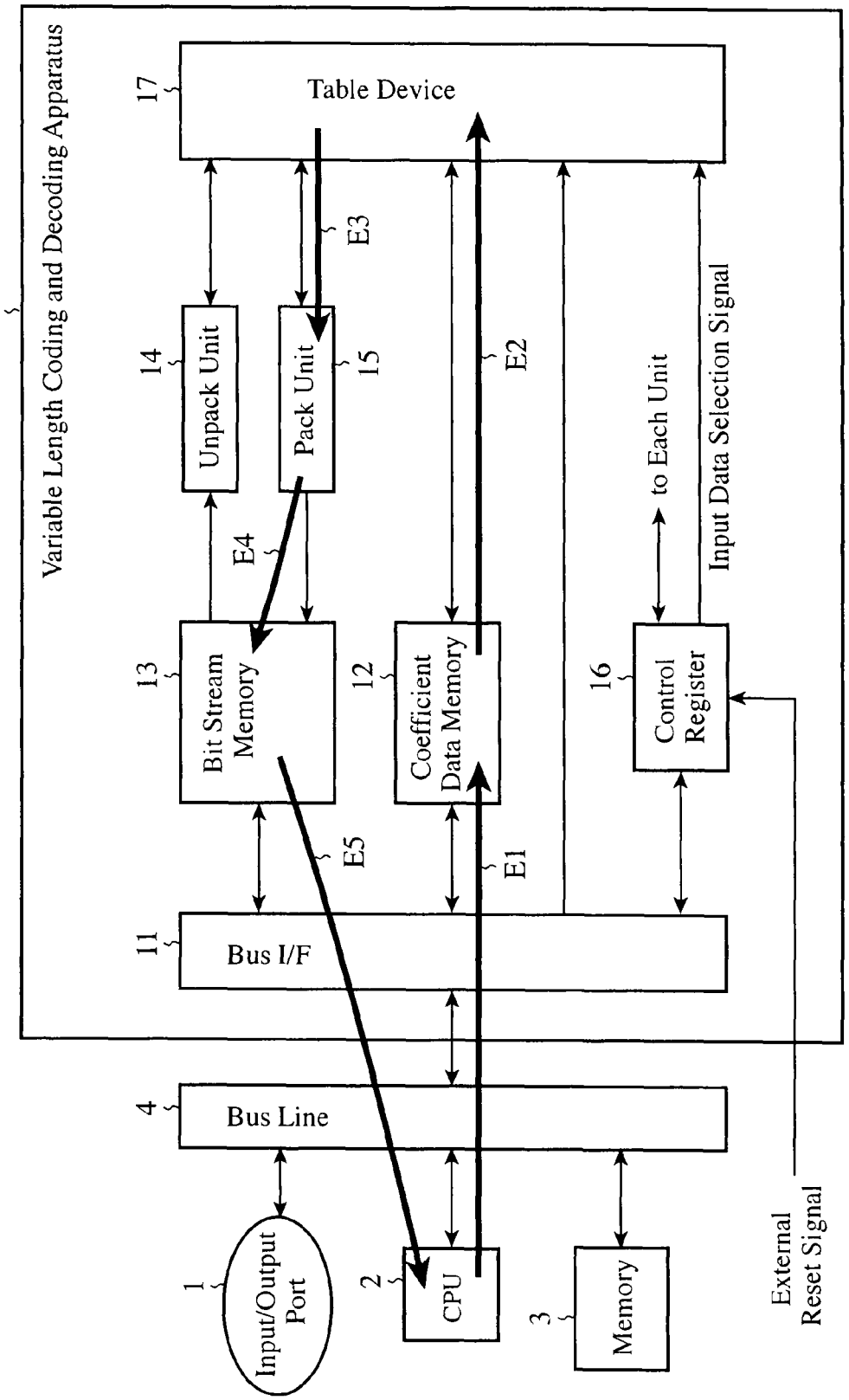
FIG. 13 is an explanatory drawing showing an example of a variable length coding operation.

Next, an example of the variable length coding operation will be explained concretely. FIG. 13 is an explanatory drawing showing the example of the variable length coding operation.

The CPU 2 controls the bus I/F 11, as mentioned above, so as to transmit the configuration data corresponding to the variable length coding, which are stored in the memory 3, to the configuration memory 21 of the table device 17.

When the configuration data are stored in the configuration memory 21, the table device 17 is set to a state in which the table device 17 can operate as the variable length decoding table.

The CPU 2 accepts coefficient data to be variable length coded from the input/output port 1, and stores a portion of the coefficient data corresponding to block data about one macro block in the coefficient data memory 12 via the bus line 4 and the bus I/F11 (an arrow E1).

When storing the coefficient data in the coefficient data memory 12, the CPU 2 writes a coding start signal for instructing a start of the coding of the coefficient data in a coding start instruction register included in the control register 16, and outputs an input data selection signal for instructing a selection of the coefficient data to the multiplexer 22 of the table device 17.

When the coding start signal is written in the coding start instruction register included in the control register 16, the table device 17 reads the coefficient data from the coefficient data memory 12 in units of a specific number of bits (an arrow E2), carries out the variable length coding according to the coefficient data, and outputs a bit stream of variable length codes which is the variable length coding results to the pack unit 15 (an arrow E3).

When receiving the bit stream from the table device 17, the pack unit 15 carries out packing of the bit stream in units of bits, such as in units of the data width of the CPU bus 2, and stores them in the bit stream memory 13 (an arrow E4), and notifies the CPU 2 that the coding of one macro block has been completed with an interrupt signal.

When receiving the interrupt signal from the pack unit 15, the CPU 2 reads the bit stream which is the variable length coding results, via the bus I/F 11, from the bit stream memory 13 (an arrow E5).

Hereafter, the variable length coding process performed by the table device 17 will be explained concretely.

Figure 14:
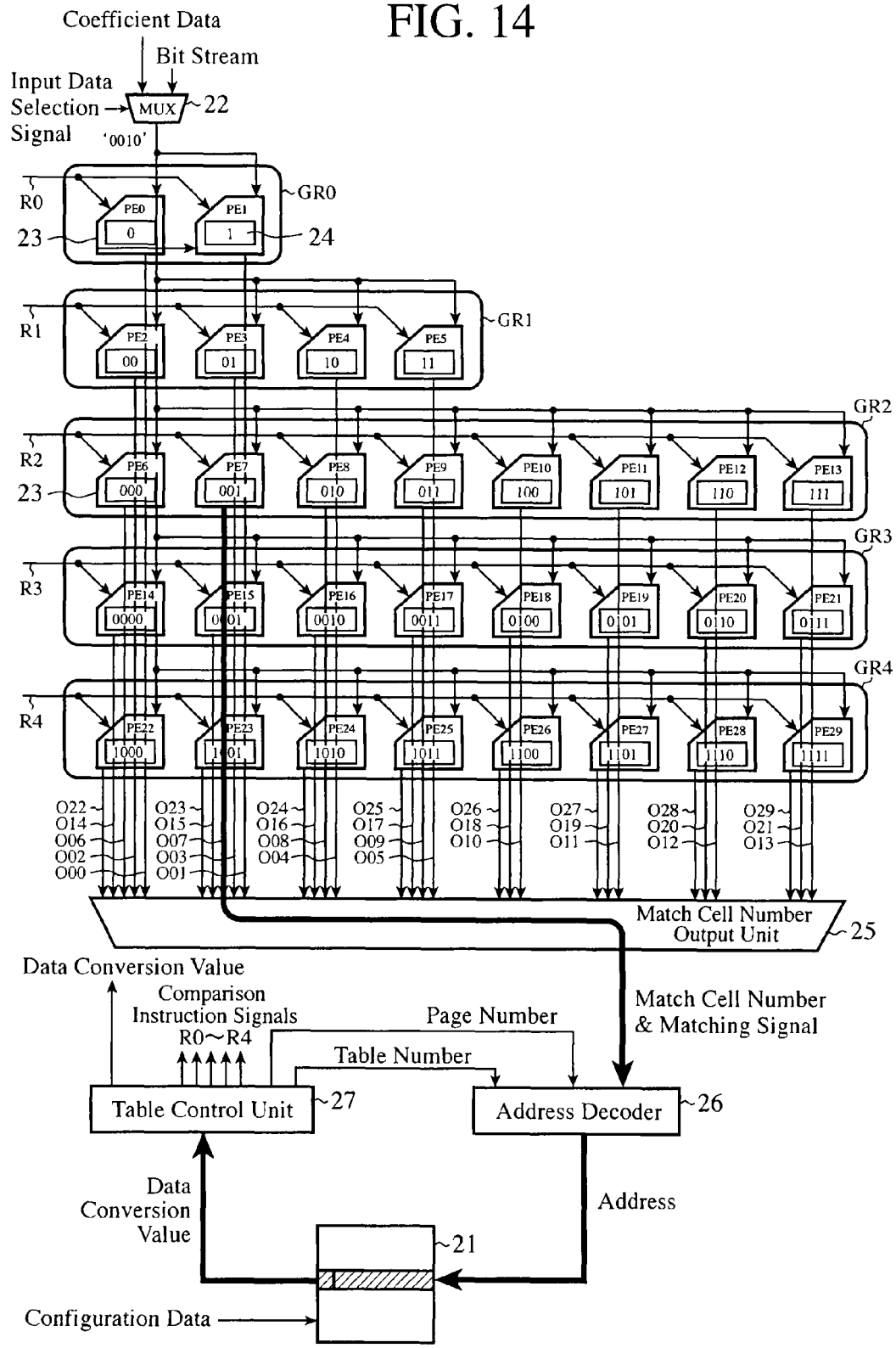
FIG. 14 is an explanatory drawing showing the variable length coding process performed by the table device 17.

Hereafter, for the sake of convenience in explanation, it is assumed that the configuration data showing the variable length decoding table shown in FIGS. 9 and 10 are stored in the configuration memory 21, and a bit stream having a specific number of bits which is inputted to the multiplexer 22 is "0010." FIG. 14 is an explanatory drawing showing the variable length coding process performed by the table device 17.

The multiplexer 22 of the table device 17 selects the coefficient data "0010" stored in the configuration memory 21 according to the input data selection signal which is outputted by the control register 16 in response to an instruction from the CPU 2, and outputs the coefficient data "0010" to the cells PE0 to PE29.

Each of the cells PE0 to PE29 accepts only a portion of the coefficient data "0010" outputted from the multiplexer 22, the portion having one or more bits whose number is the same as the number of bits of its comparison object value, and which are counted from the leading bit of the coefficient data "0010".

More specifically, each of the cells PE0 and PE1 whose comparison object value consists of one bit accepts "0", each of the cells PE2 to PE5 whose comparison object value consists of two bits accepts "00", each of the cells PE6 and PE13 whose comparison object value consists of three bits accepts "001", and each of the cells PE14 and PE29 whose comparison object value consists of four bits accepts "0010."

When the coding start signal is written in the coding start instruction register included in the control register 16, the table control unit 27 acquires, from the control register 16, the table number specifying the variable length coding table of FIGS. 9 and 10, the page number which is used at the time of start of the comparison operation (typically, the number of the page to which the subtree including the root node of the search tree is mapped), and the initial code specifying the cell group GR2 which is made to carry out the comparison process.

The table control unit 27 outputs both the table number specifying the variable length coding table of FIGS. 9 and 10 and the page number which is used at the time of start of the comparison operation to the address decoder 26, and outputs the comparison instruction signal R2 to the cell group GR2.

When receiving the comparison instruction signal R2 from the table control unit 27, the cells PE6 and PE13 which belong to the cell group GR2 perform comparison of their respective specific comparison object values with the bit sequence inputted thereto from the multiplexer 22.

More specifically, the cells PE6 to PE13 carry out the following comparison processes, respectively.

|  | Comparison object value | Input bit sequence | Comparison result |
| --- | --- | --- | --- |
| Cell PE6 | 000 | 001 | Mismatch |
| Cell PE7 | 001 | 001 | Match |
| Cell PE8 | 010 | 001 | Mismatch |
| Cell PE9 | 011 | 001 | Mismatch |
| Cell PE10 | 100 | 001 | Mismatch |
| Cell PE11 | 101 | 001 | Mismatch |
| Cell PE12 | 110 | 001 | Mismatch |
| Cell PE13 | 111 | 001 | Mismatch |

In this case, because the result of the comparison process performed by the cell PE7 shows a match, a matching signal O07 is outputted from the cell PE7 to the match cell number output unit 25.

When receiving the matching signal O07 from the cell PE7, the match cell number output unit 25 outputs a matching signal which shows that there exists a cell PE which provides a comparison process result showing a match to the address decoder 26, and further outputs a match cell number showing that the cell P which has provided the comparison process result showing a match is the cell PE7 to the address decoder 26.

Although, in this case, only the cell PE7 has provided a comparison process result showing a match, when simultaneously receiving matching signals O from a plurality of cells PE, the match cell number output unit outputs a larger one of the cell numbers respectively showing the cells by giving higher priority to it in a case in which, for example, cell numbers are given to the cells PE0 to PE29 in such a way that the smaller number of bits the specific comparison object value of a cell has the smaller number is assigned to the cell.

For example, when receiving the matching signals O00 and 007 from the cells PE0 and PE7 simultaneously, the match cell number output unit outputs a match cell number indicating the cell PE7 to which a larger cell number is assigned to the address decoder 26.

When receiving the matching signal and the match cell number from the match cell number output unit 25, the address decoder 26 specifies the node corresponding to the match cell number (the node n2 mapped to the cell PE7) from among the nodes of the subtree which is included in the search tree which constructs the conversion table (the variable length coding table shown in FIGS. 9 and 10) specified by the table number outputted from the table control unit 27, and which is mapped to the page specified by the page number outputted from the table control unit 27.

After specifying the node n2 corresponding to the match cell number, the address decoder 26 generates an address in the configuration memory 21 in which the data conversion value (a bit stream of variable length codes or a branch code of the search tree) assigned to the node n2 is stored.

The table control unit 27 acquires the data conversion value stored at the address generated by the address decoder 26 from among the data conversion values stored in the configuration memory 21.

When the data conversion value is a bit stream of variable length codes, the table control unit 27 outputs the data conversion value to the pack unit 5, whereas when the data conversion value is a branch code of the search tree, the table control unit 27 acquires both a specification code indicating the cell group GR to which the table control unit furnishes the comparison instruction signal R the next time from the branch code to update the cell group GR to which the table control unit furnishes the comparison instruction signal R.

Because the node n2 is a branch node as shown in FIG. 10, a branch code of the search tree is assigned to the node n2, the table control unit 27 acquires both a specification code indicating the cell group GR to which the table control unit furnishes the comparison instruction signal R the next time and a page number which is used the next time from the branch code to update the cell group GR to which the table control unit furnishes the comparison instruction signal R.

More specifically, because the subtree comprised of the nodes n10 to n18 connected to the node n2 is mapped to the cells PE14 to PE16, PE18 to PE20, PE22, PE23, and PE26 of another page, respectively, as shown in FIG. 12, the table control unit 27 outputs the page number showing the other page to the address decoder 26.

Figure 15:
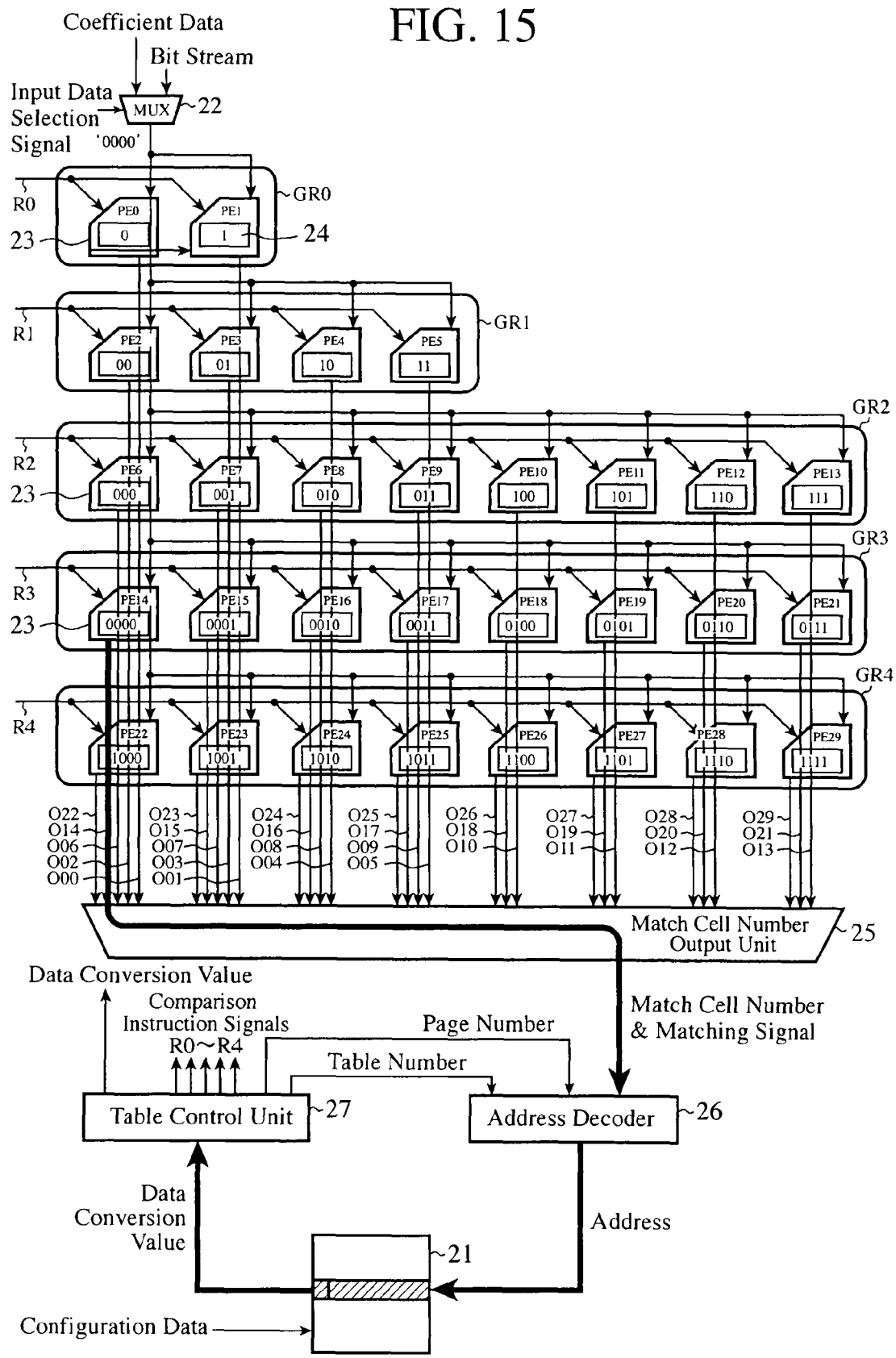
FIG. 15 is an explanatory drawing showing the variable length coding process performed by the table device 17.

The table control unit 27 outputs the comparison instruction signals R3 and R4 to the cell group GR3 to which the cells PE14 to PE16 and PE18 to PE20 belong and the cell group GR4 to which the cells PE22, PE23, and PE26 belong, respectively, so as to reconstruct the variable length decoding table (refer to FIG. 15).

As a result, when each of the cells PE13 to PE29 belonging to the cell groups GR3 and GR 4 receives the comparison instruction signal R3 or R4, each of the cells PE13 to PE29 compares a portion, at the branch point and lower points (lower bits than "001"), of the input bit sequence with its specific comparison object value.

More specifically, each of the cells PE13 to PE29 belonging to the cell groups GR3 and GR 4 receives the comparison instruction signal R3 or R4 from the table control unit 27, and, when accepting, as the portion at the branch point and lower points (lower bits than "001") of the input bit sequence from the multiplexer 22, e.g. "0000", and performs a second-time comparison process on the portion.

In this case, the comparison process result obtained by the cell PE14 shows a match, and a matching signal O14 is outputted from the cell PE14 to the match cell number output unit 25.

When receiving the matching signal O14 from the cell PE14, the match cell number output unit 25 outputs a match cell number showing that there exists a cell PE which provides a comparison process result showing a match to the address decoder 26, and further outputs a match cell number showing that the cell P which has provided the comparison process result showing a match is the cell PE14 to the address decoder 26.

When receiving the match cell number indicating the cell PE14 from the match cell number output unit 25, the address decoder 26 specifies the node corresponding to the match cell number (the node n10 mapped to the cell PE14) from among the nodes of the subtree which is included in the search tree which constructs the conversion table (the variable length coding table shown in FIGS. 9 and 10) specified by the table number outputted from the table control unit 27, and which is mapped to the page specified by the page number outputted from the table control unit 27.

After specifying the node n10 corresponding to the match cell number, the address decoder 26 generates an address in the configuration memory 21 in which the data conversion value (a bit stream of variable length codes or a branch code of the search tree) assigned to the node n10 is stored.

The table control unit 27 acquires the data conversion value stored at the address generated by the address decoder from among the data conversion values stored in the configuration memory 21.

When the data conversion value is a bit stream of variable length codes, the table control unit 27 outputs the data conversion value to the pack unit 5, whereas when the data conversion value is a branch code of the search tree, the table control unit 27 acquires both a specification code indicating the cell group GR to which the table control unit furnishes the comparison instruction signal R the next time and a page number which is used the next time from the branch code to update the cell group GR to which the table control unit furnishes the comparison instruction signal R.

Because the node n1 is a terminal node as shown in FIG. 10, a data conversion value which is a bit stream of variable length codes "0000000111" is assigned to the node n10, and the table control unit 27 outputs the bit stream "0000000111" to the pack unit 15.

As can be seen from the above description, the table device in accordance with this Embodiment 1 is provided with the cells PE0 to PE29 each of which compares its specific comparison object value with the input data when receiving the comparison instruction signal, and, when the comparison object value matches the input data, outputs the matching signal, the match cell number output unit 25 which outputs a match cell number showing a cell PE among the cells PE0 to PE29 which has outputted the matching signal, and the address decoder 26 which specifies the node corresponding to the match cell number outputted from the match cell number output unit 25 from among the nodes of the search tree which constructs the conversion table, and the table control unit 27 is constructed in such a way as to acquire the data conversion value assigned to the node specified by the address decoder 26 from the configuration memory 21, and, when the data conversion value is data showing a coded result or a decoded result, output the data conversion value to outside the table device, or update the cell PE to which the table control unit furnishes the comparison instruction signal when the data conversion value is a branch code of the search tree. Therefore, the table device in accordance with this Embodiment 1 makes it possible to carry out the variable length coding process and the variable length decoding process without carrying out the writing process of writing the configuration data in the register group of any cell PE. As a result, this embodiment offers an advantage of being able to achieve an improvement in the speed of the variable length coding process and in the speed of the variable length decoding process.

More specifically, because the table device in accordance with this Embodiment 1 can set up the configuration data in such a way that the configuration data comply with a variable length coding method or a variable length decoding method based on the international standards, the table device can construct a table which can be dynamically restructured for any of various methods.

Furthermore, because the variable length coding and decoding apparatus equipped with this table device 17 can carry out both the variable length coding process and the variable length decoding process using one circuit, the variable length coding and decoding apparatus can be downsized and its power consumption can be reduced.

Furthermore, even in a case in which the number of bits which can be compared using a set of cells which are being currently used does not satisfy a maximum number of bits which should be compared, a comparison of the maximum number of bits can be made by reconstructing the cells. By holding the configuration data about the table in the configuration memory 21, the necessity for the CPU 2 to rewrite the configuration data in the table device again while the table device performs comparison operations even when the table has a large size can be eliminated, and therefore the number of cycles required for the configuration can be reduced greatly.

Embodiment 2

Figure 16:
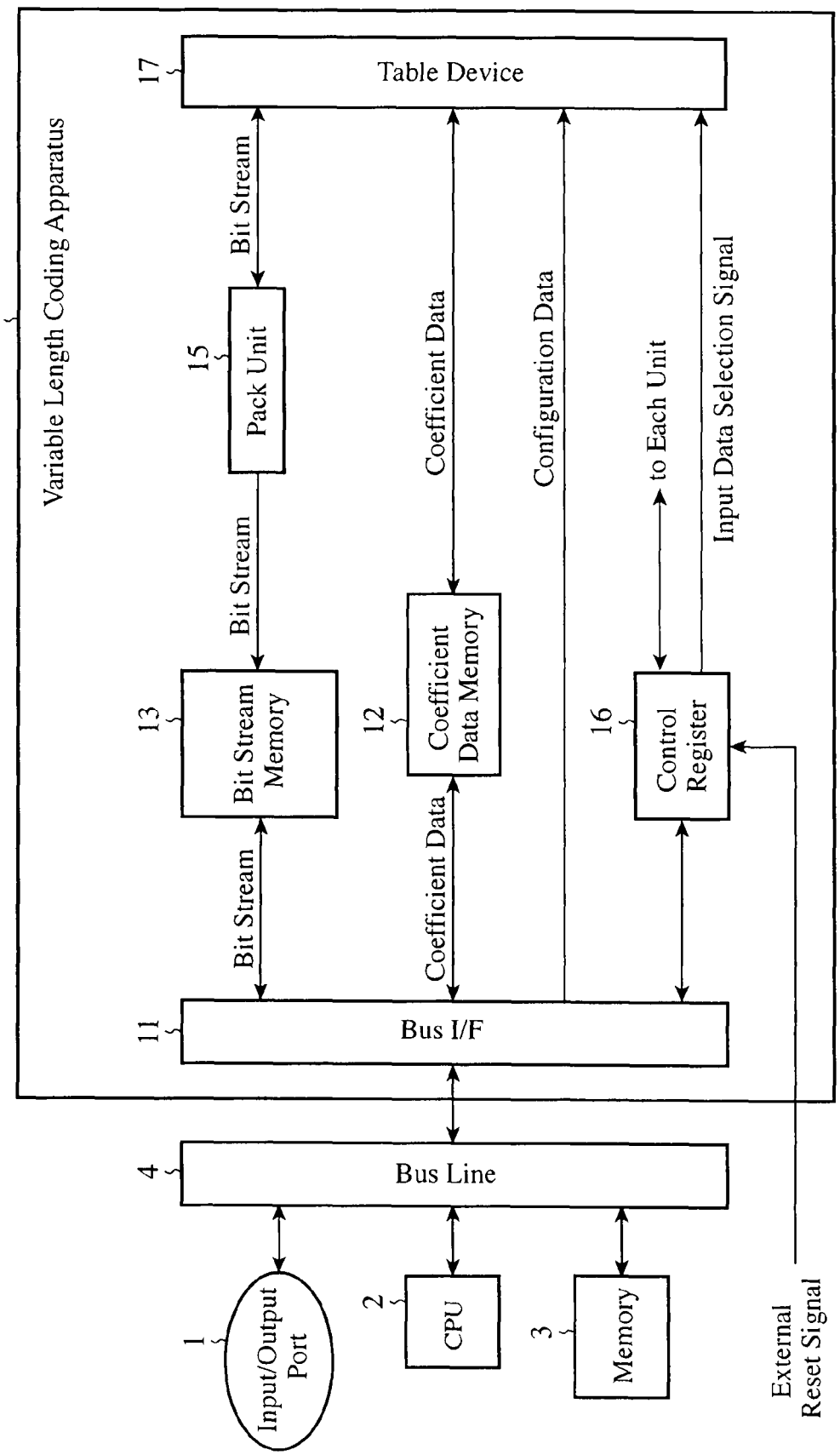
FIG. 16 is a block diagram showing a variable length coding apparatus in accordance with Embodiment 2 of the present invention.

In above-mentioned Embodiment 1, the variable length coding and decoding apparatus equipped with the table device 17 is shown. As an alternative, a variable length coding apparatus which carries out a variable length coding process can be constructed using the table device 17, as shown in FIG. 16.

In this case, the unpack unit 14 shown in FIG. 1 is eliminated.

Embodiment 3

Figure 17:
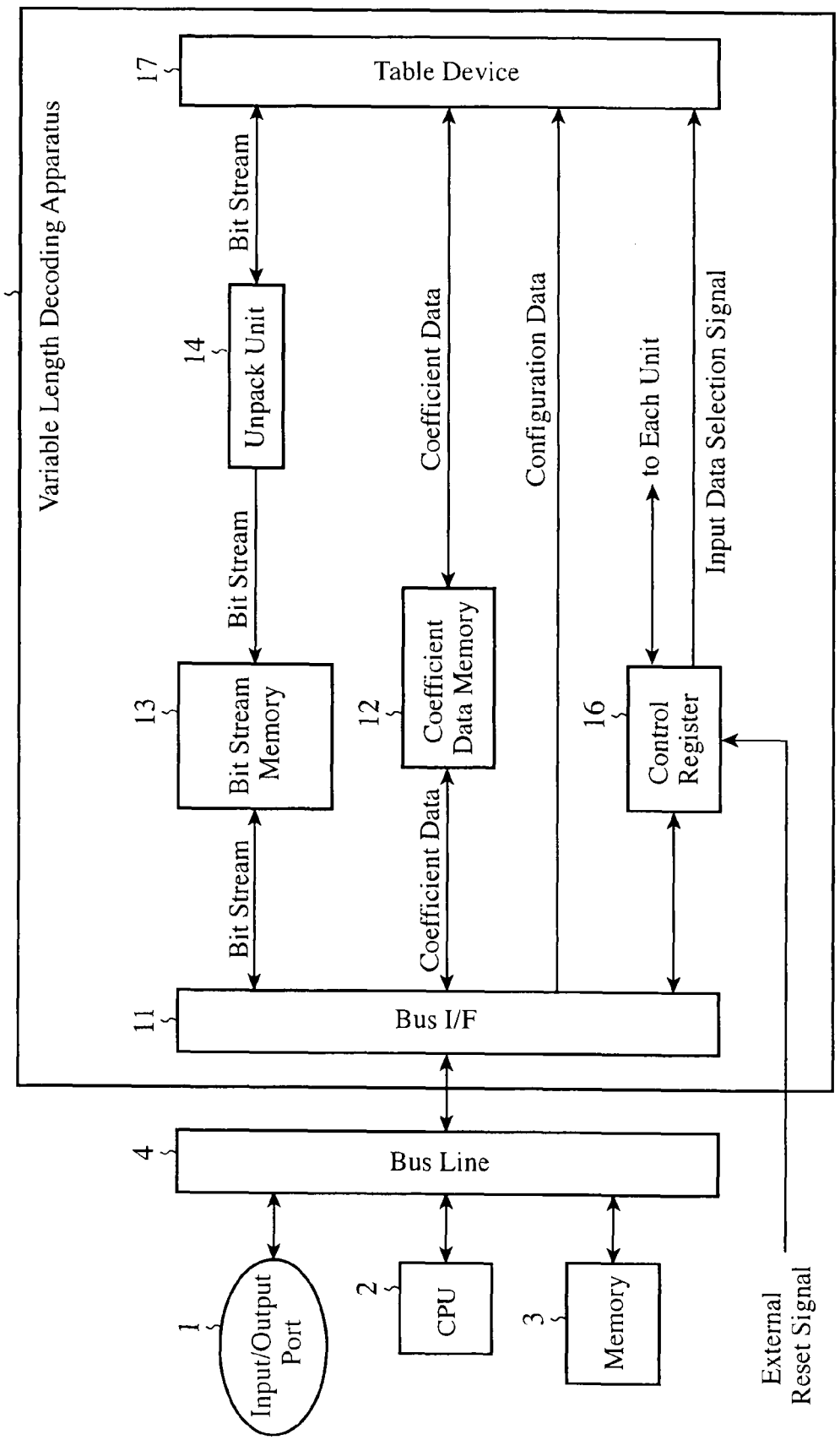
FIG. 17 is a block diagram showing a variable length decoding apparatus in accordance with Embodiment 3 of the present invention.

In above-mentioned Embodiment 1, the variable length coding and decoding apparatus equipped with the table device 17 is shown. As an alternative, a variable length decoding apparatus which carries out a variable length decoding process can be constructed using the table device 17, as shown in FIG. 17.

In this case, the pack unit 15 shown in FIG. 1 is eliminated.

Embodiment 4

Figure 18:
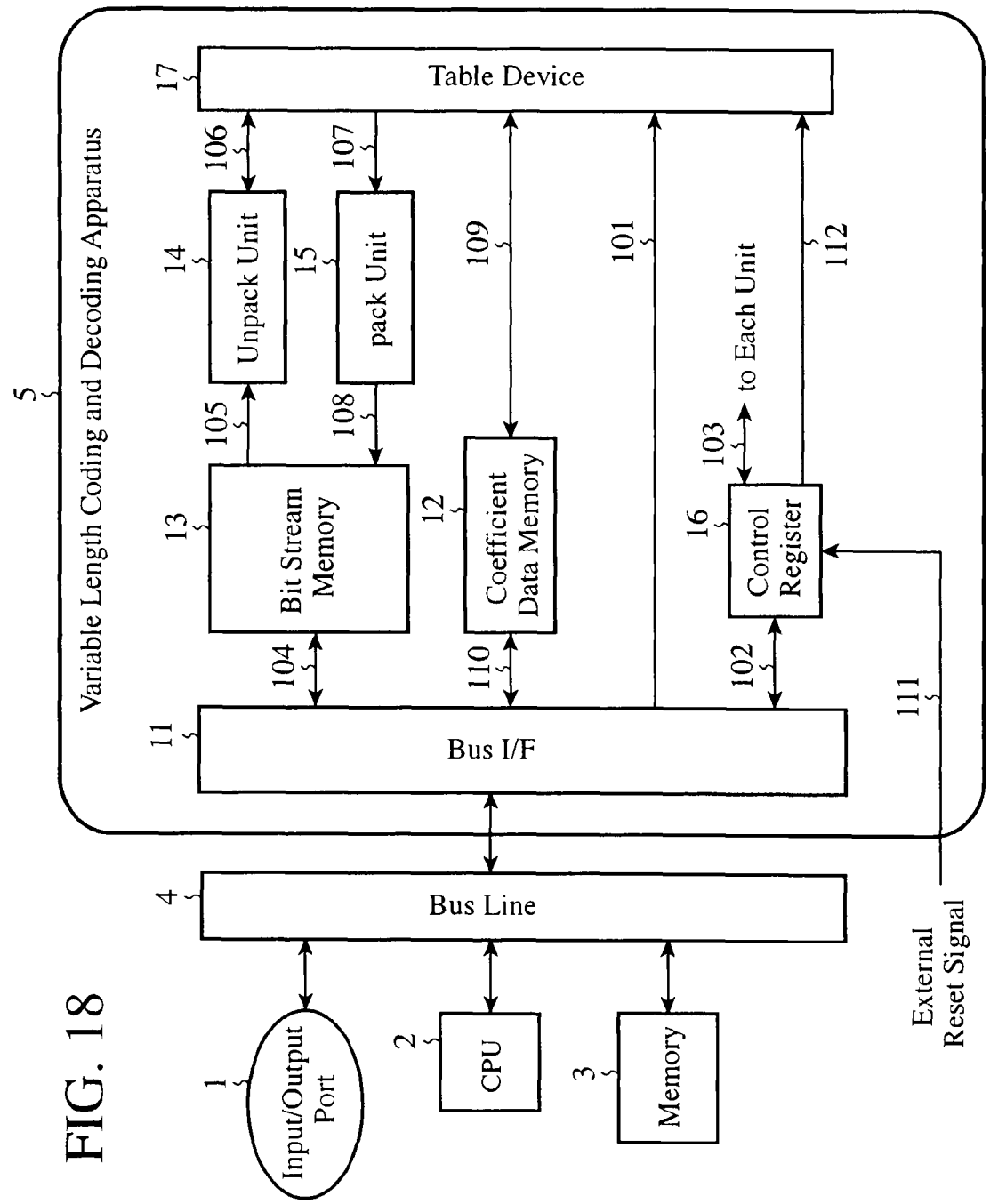
FIG. 18 is a block diagram showing a variable length coding and decoding apparatus in accordance with Embodiment 4 of the present invention.

FIG. 18 is a block diagram showing a variable length coding and decoding apparatus in accordance with Embodiment 4 of the present invention.

An input/output port 1 captures image data and then outputs a bit stream coded by the variable length coding and decoding apparatus 5 at the time of variable length coding, while the input/output port 1 captures a bit stream and then outputs image data decoded by the variable length coding and decoding apparatus 5 at the time of variable length decoding.

A CPU 2 controls each unit, and also performs steps except a variable length coding step or a variable length decoding step, the steps being included in either a coding process of coding a moving image or a decoding process of decoding moving image. A memory 3 is an area for storing a command which the CPU 2 will process, configuration data, and so on. A bus line 4 is a path which is used for transfer of data among the input/output port 1, the CPU 2, the memory 3, and the variable length coding and decoding apparatus 5.

The variable length coding and decoding apparatus 5 is constructed in such a way as to include a bus I/F 11, a coefficient data memory 12, a bit stream memory 13, an unpack unit 14, a pack unit 15, a control register 16, and a table device 17. The coefficient data memory 12 is a means for storing either coefficient data to be coded or decoded coefficient data. The bus I/F 11 is a path which is used for transfer of data between the CPU 2 and each unit of the variable length coding and decoding apparatus 5. The bit stream memory 13 is a means for storing either a bit stream to be decoded, or a bit stream which is a coded result.

The unpack unit 14 is a means for shifting a fixed-length bit stream, which the unpack unit has read from the bit stream memory 13 in units of bits, such as in units of the data width of the CPU bus, at the time of decoding, by a number of bits which has been consumed in the decoding by the table device 17 to output the fixed-length bit stream bit-shifted as input data inputted to the table device 17. The pack unit 15 is a means for packing a bit stream of variable length codes which has been acquired, as coded output data, by the table device 17 at the time of coding in data in units of bits (fixed length data), such as in units of the data width of the CPU bus, and for storing the data in the bit stream memory 13.

The control register 16 is a means which is reset by an external reset signal, for, in response to an instruction from the CPU 2, setting up an input data selection signal which is used for selection of input data to be inputted to the table device 17 at the time of performing configuration, variable length coding, or variable length decoding, and an initial code specifying both a selection of a register of a output value register group 32 which will be mentioned below (refer to FIG. 20) which the table device 17 uses at the time of start of comparison operations, and a cell group which is made to start comparison operations in a case of constructing a plurality of cell groups.

A signal line 101 is the one via which both configuration data set to the table device 17 from the CPU 2 via the bus I/F 11 and a register specification address signal specifying a register included in the table device 17 to which the configuration data are to be written are transferred immediately before variable length coding is started and immediately before variable length decoding is started. A signal line 102 is the one via which the CPU 2 writes and reads information to and from the control register 16 by way of the bus line 4 and the bus I/F 11. A signal line 103 is connected to each unit which constructs the variable length coding and decoding apparatus 5, and is the one via which the operation mode of each unit is set up and each unit writes and reads information to and from the control register 16.

A signal line 104 is the one via which the CPU 2 writes and reads bit stream data to and from the bit stream memory 13 by way of the bus line 4 and the bus I/F 11. A signal line 105 is the one via which the bit stream memory 13 transfers bit stream data to the unpack unit 14 at the time of decoding. A signal line 106 is the one via which the unpack unit 14 transfers bit stream data to the table device 17 at the time of decoding, and via which the table device 17 transmits a shift value to the unpack unit 14. A signal line 107 is the one via which the table device 17 transfers coded data to the pack unit 15 at the time of coding.

A signal line 108 is the one via which the pack unit 15 transfers bit stream data to the bit stream memory 13 at the time of coding. A signal line 109 is the one via which the coefficient data memory 12 transfers data to be coded to the table device 17 at the time of coding, and via which the table device 17 transfers coefficient data or decoded data to the coefficient data memory 12 at the time of decoding. A signal line 110 is the one via which the CPU 2 writes coefficient data or data to be coded in the coefficient data memory 12 at the time of coding, and via which the CPU 2 reads coefficient data or decoded data from the coefficient data memory 12 at the time of decoding. A signal line 111 is a supply line via which an external reset signal to be provided to the control register 16 from outside the apparatus is supplied in order to reset the variable length coding and decoding apparatus 5.

Figure 19:
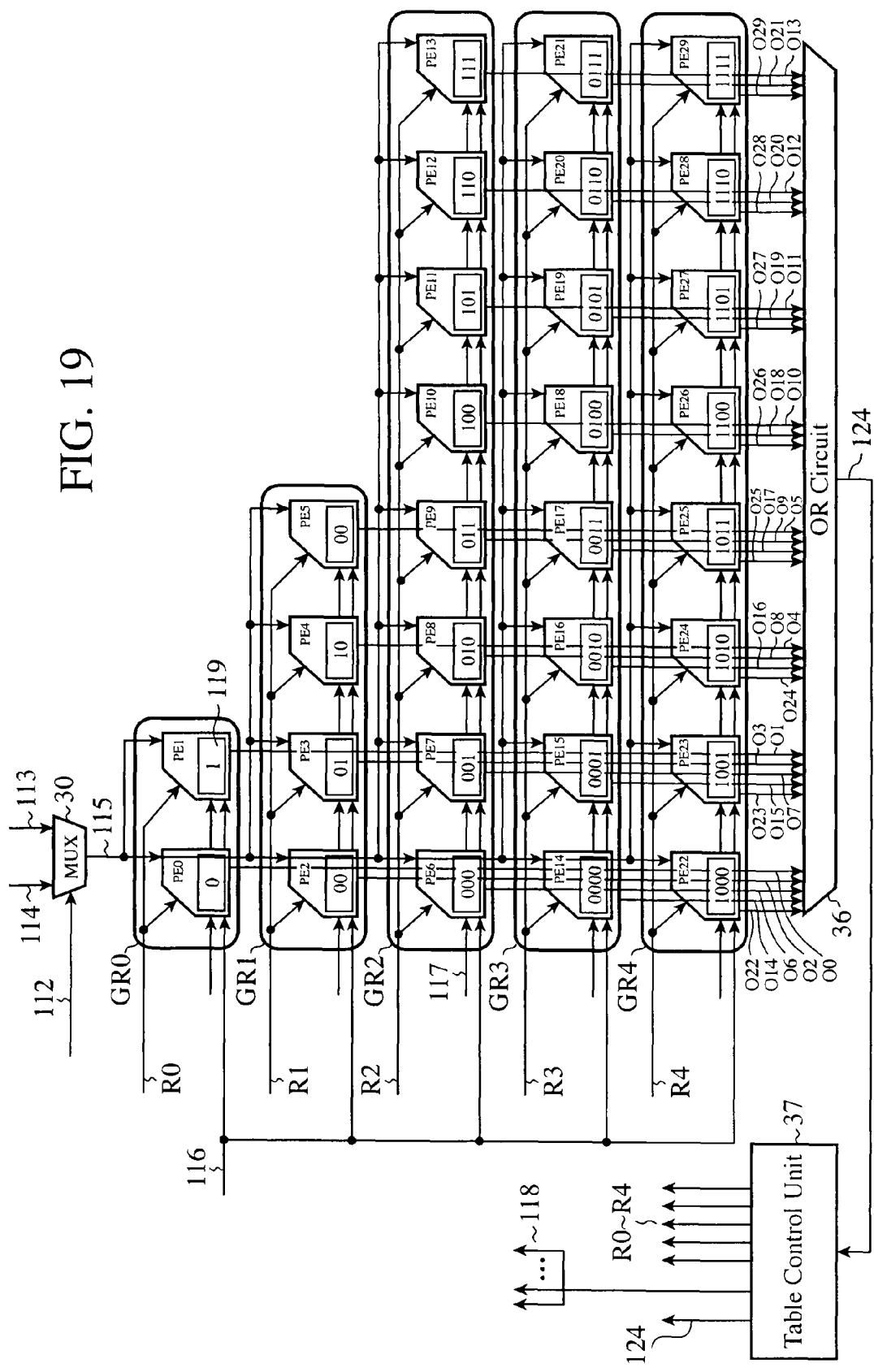
FIG. 19 is a block diagram showing an example of the structure of a table device shown in FIG. 18.

FIG. 19 is a block diagram showing an example of the structure of the table device shown in FIG. 18. In FIG. 19, the table device 17 is provided with a plurality of cells PE0 to PE29 (referred to as cells from here on) which can be dynamically restructured, a multiplexer (referred to as an MUX from here on) 30, an OR circuit 36, and a table control unit 37. The cells PE0 to PE29 are divided into groups according to the bit lengths of their specific comparison object values 119.

For example, the cells PE0 to PE29 are divided into groups in such a way that the cells PE0 and PE1 having a comparison object value 119 whose bit length is one bit belong to a cell group GR0, the cells PE2 to PE5 having a comparison object value 119 whose bit length is two bits belong to a cell group GR1, the cells PE6 to PE13 having a comparison object value 119 whose bit length is three bits belong to a cell group GR2, and the cells PE14 to PE21 and PE22 to PE29 having a comparison object value 119 whose bit length is four bits are divided into groups GR3 and GR4, respectively.

The MUX 30 is a means for selecting input data 115 to be provided to the cells PE0 to PE29. More specifically, in a case in which the variable length coding and decoding apparatus 5 is set to either coding mode or decoding mode, on the basis of the input data selection signal 112 provided thereto from the control register 16 shown in FIG. 18, the variable length coding and decoding apparatus 5 selects, as input data 115 to be inputted to the cells PE0 to PE29 in the table device 17, coefficient data 114 in the coding mode, or selects bit stream data 113 in the decoding mode.

Configuration data (a conversion table) 116 are provided to the cells together with the register specification address signal 117, via the signal line 101 shown in FIG. 18, from the bus I/F 11 in the configuration mode. The register specification address signal 117 is used for specifying both a cell which is the destination of the writing of the configuration data 116 and a register in the cell, and is inputted to all of the cells PE0 to PE29.

Output signals O0 to O29 are outputted from the cells PE0 to PE29 in either of the coding mode and the decoding mode, respectively, and each of them includes a matching signal (designated by a reference numeral 122 in FIG. 20 which will be mentioned below) indicating that the result of a comparison operation which will be mentioned below shows a match, and an output value (a data conversion value) outputted from the register thereof when the result of the comparison operation shows a match, or a branch code (designated by a reference numeral 123 in FIG. 20 which will be mentioned below). The OR circuit 36 is a means for implementing an OR operation on the output signals O0 to O29 to acquire, as data output 124 of the table device 17, the result of the OR operation.

The table control unit 37 is a cell control means for, when the data output 124 of the OR circuit 36 is a branch code, generating a register selection signal 118 specifying a register which is used the next time from an output value register group (designated by a reference numeral 32 in FIG. 20 which will be mentioned below) in the cell on the basis of the register selection value which constructs the branch code, and for generating comparison instruction signals R0 to R4 which are to be transmitted to a cell group which performs comparison operations the next time on the basis of a specification code specifying a cell group which constructs the branch code. In contrast, when the data output 124 of the OR circuit 36 is data showing a coded result or a decoded result, the table control unit 37 outputs the data output 124.

Figure 20:
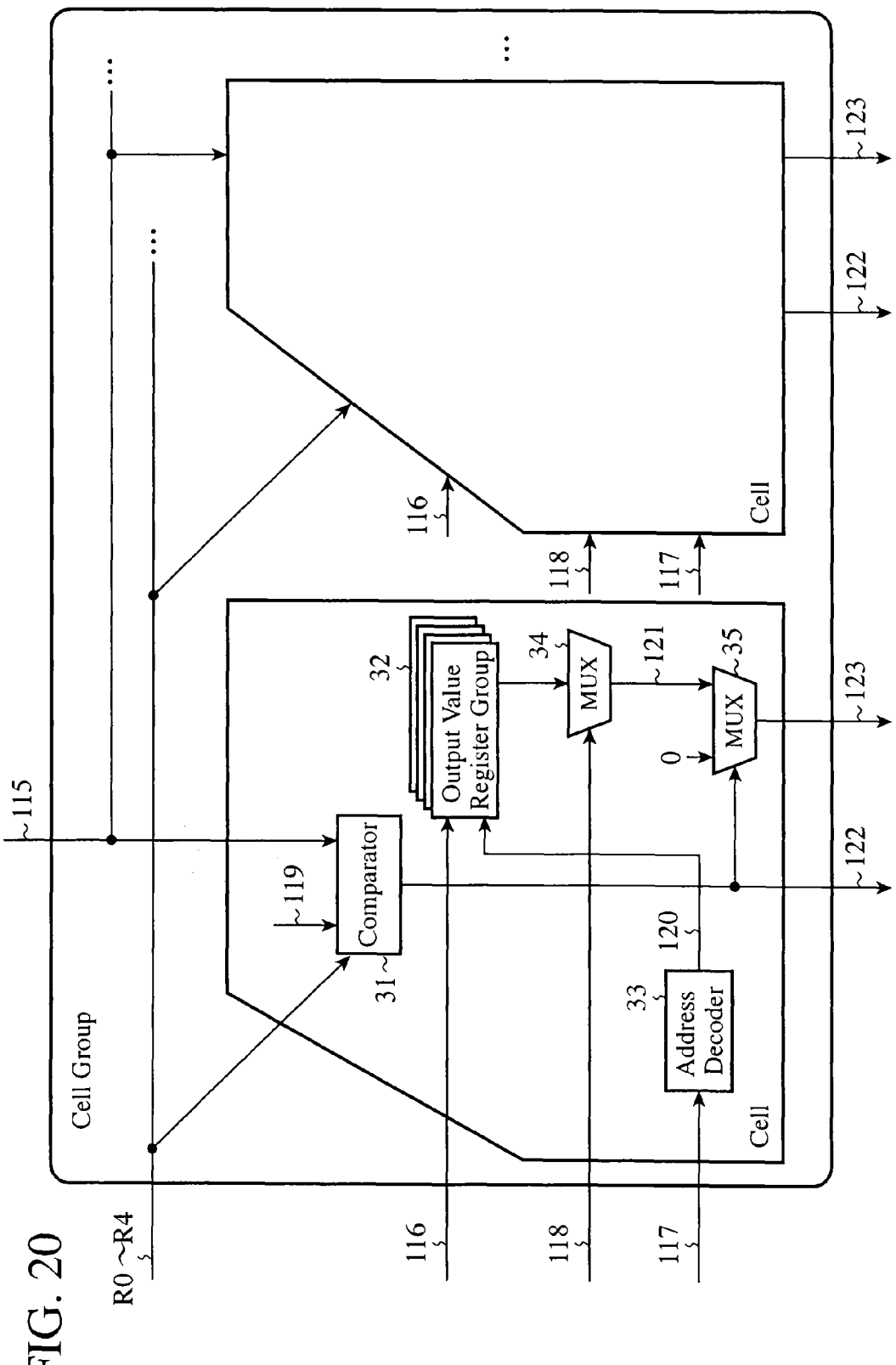
FIG. 20 is a block diagram showing an example of the configuration of cell groups shown in FIG. 19.

FIG. 20 is a block diagram showing an example of the configuration of a cell group shown in FIG. 19. In FIG. 20, each cell has a comparator 31, an output value register group 32, an address decoder 33, an MUX 34, and an MUX 35. The address decoder 33 is a means for decoding the register specification address signal 117 inputted thereto in the configuration mode to specify a register of the output value register group 32 to which the configuration data 116 are to be written with the decoded signal 120.

The comparator 31 is a means for comparing the input data 115 with the comparison object value 119 which is a fixed value specific to each cell to output a matching signal 122 when they match each other. The bit length of the comparison object value 119 specific to each cell is determined for each of the cell groups GR0 to GR4.

For example, in FIG. 19, the bit length of the comparison object value 119 of each cell in the cell group GR0 is one bit, and the bit pattern of the comparison object value 119 of the cell PE0 is '0' and the bit pattern of the comparison object value 119 of the cell PE1 is '1'. The bit length of the comparison object value 119 of each cell in the cell group GR1 is two bits, and the bit pattern of the comparison object value 119 of the cell PE2 is '00', the bit pattern of the comparison object value 119 of the cell PE3 is '01', the bit pattern of the comparison object value 119 of the cell PE4 is '10', and the bit pattern of the comparison object value 119 of the cell PE5 is '11'.

The bit length of the comparison object value 119 of each cell in the cell group GR2 is three bits, and the bit pattern of the comparison object value 119 of the cell PE6 is '000', the bit pattern of the comparison object value 119 of the cell PE7 is '001', the bit pattern of the comparison object value 119 of the cell PE8 is '010', the bit pattern of the comparison object value 119 of the cell PE9 is '011', the bit pattern of the comparison object value 119 of the cell PE10 is '100', the bit pattern of the comparison object value 119 of the cell PE11 is '101', the bit pattern of the comparison object value 119 of the cell PE12 is '110', and the bit pattern of the comparison object value 119 of the cell PE13 is '111'.

The bit length of the comparison object value 119 of each cell in the cell group GR3 is four bits, and the bit pattern of the comparison object value 119 of the cell PE14 is '0000', the bit pattern of the comparison object value 119 of the cell PE15 is '0001', the bit pattern of the comparison object value 119 of the cell PE16 is '0010', the bit pattern of the comparison object value 119 of the cell PE17 is '0011', the bit pattern of the comparison object value 119 of the cell PE18 is '0100', the bit pattern of the comparison object value 119 of the cell PE19 is '0101', the bit pattern of the comparison object value 119 of the cell PE20 is '0110', and the bit pattern of the comparison object value 119 of the cell PE21 is '0111'.

The bit length of the comparison object value 119 of each cell in the cell group GR4 is four bits, and the bit pattern of the comparison object value 119 of the cell PE22 is '1000', the bit pattern of the comparison object value 119 of the cell PE23 is '1001', the bit pattern of the comparison object value 119 of the cell PE24 is '1010', the bit pattern of the comparison object value 119 of the cell PE25 is '1011', the bit pattern of the comparison object value 119 of the cell PE26 is '1100', the bit pattern of the comparison object value 119 of the cell PE27 is '1101', the bit pattern of the comparison object value

119 of the cell PE28 is '1110', and the bit pattern of the comparison object value 119 of the cell PE29 is '1111'.

Each of the cell groups GR0 to GR4 accepts only a portion of the input data 115, the portion having the same number of bits, which is counted from the leading bit of the input data, as the comparison object values 119 of the cells which belong to each of the cell groups GR0 to GR4.

In FIG. 20, the output value register group 32 is a means to which the configuration data 116 are written at the time of the configuration, and which includes a plurality of registers for holding an output value (orthogonal transformation coefficients at the time of decoding, or a bit stream having an unspecified length at the time of coding) which is a data conversion value, and a branch code instead of the output value. More specifically, when a cell provides a comparison operation result showing a match, when the cell is what is specified as a leaf which calculates a final value, the output value is written in a corresponding register of the output value register group 32 of the cell, whereas when the cell is specified as a branch, a branch code is written in a corresponding register of the output value register group of the cell.

The branch code includes a register selection value which is used for changing the register of the output value register group 32 to the register which is used the next time, and a specification code specifying the cell group which performs comparison operations the next time.

The MUX 34 is a register selecting means for selecting a register of the output value register group 32 on the basis of the register selection signal 118, and for outputting the output value or the branch code held by the register as an output value 121. The MUX 35 is a means for selecting either the output value or the branch code, which is selected from the output value register group 32 by the MUX 34, on the basis of the matching signal 122, and for, otherwise, i.e., when the matching signal 122 is not outputted from the comparator 31 and when the cell in question is not a cell which is a target for comparison, selecting '0' and outputting this as output data 123.

Next, the configuration mode will be explained with reference to FIGS. 18 to 20.

First, immediately after, for example, powered on, the variable length coding and decoding apparatus 5 is reset by either an external reset signal provided from outside the variable length coding and decoding apparatus or a software reset signal which is generated through a setup of the control register 16. After the variable length coding and decoding apparatus is reset, each of the unpack unit 14, the pack unit 15, and the table device 17 enters an initial state and holds its initial state until receiving a start instruction from the CPU 2. After started, the CPU 2 transmits the configuration data corresponding to the variable length coding or the variable length decoding to the table device 17 via the signal line 101 together with the register specification address signal as an initializing operation.

As shown in FIGS. 19 and 20, the configuration data 116 are inputted to each of the cells PE0 to PE29 which construct the table device 17. In each of the cells PE0 to PE29, the register specification address signal 117 is decoded by the address decoder 33, and a target register to which data to be written is specified from the output value register group 32 of each cell by the decoded signal 120. As a result, corresponding data of the configuration data 116 are written in this specified register of each cell.

At that time, before performing the configuration operation, the table device 17 has only to write the configuration data 116 in the register to which the configuration data 116 are mapped by resetting the values of all the registers of the table device to '0', and can eliminate the writing operation of writing the configuration data to any register to which the configuration data 116 are not mapped. Through this operation, the table device 17 is set to a state in which the table device 17 can operate as a variable length coding table or a variable length decoding table.

Next, the mapping method of mapping the configuration data will be explained.

Figures 21, 22:
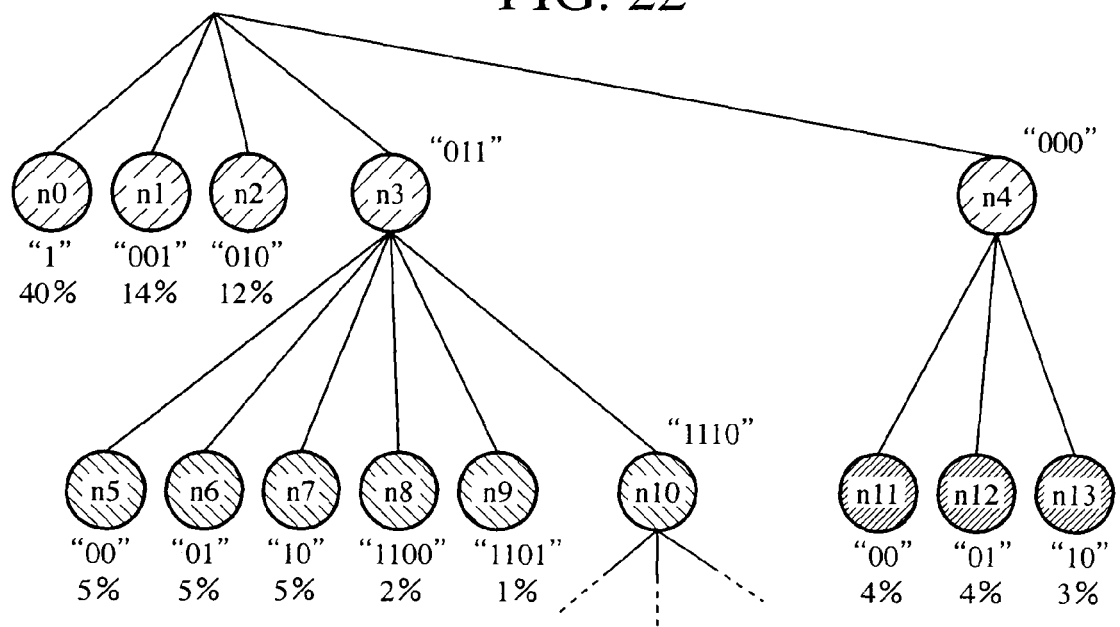
FIG. 21 is a view showing an example of the configuration of a variable length decoding table.
FIG. 22 is a view showing an example of comparison assignment of the variable length decoding table.

FIG. 21 is a view showing an example of the configuration of the variable length decoding table. In the example of FIG. 21, a binary variable length code, a decimal decoded value corresponding to this binary variable length code, and a match probability in comparison with a variable length code which is calculated beforehand are set up. The table device 17 can carry out a comparison of up to four bits at a time. Furthermore, when the variable length coding table or the variable length decoding table is constructed in such a way as to require a larger number of bits than four bits, the whole table is implemented by changing the register which is used in each cell of the table device 17, as will be mentioned below.

In this case, what is needed is to reduce the number of times that switching among the registers is carried out, and therefore the mapping of the configuration data to each register of each cell is carried out on the basis of the above-mentioned comparison match probability which is calculated beforehand. Concretely, in the variable length coding, a shorter code is assigned to a coefficient having a higher comparison match probability, and the mapping is carried out in such a way that a code having a higher comparison match probability is compared at an earlier time.

In FIG. 21, it is assumed that a probability that there is a match with either of the variable length codes set in the uppermost three rows of the table is 66%. Because each of the plurality of cells PE0 to PE29 which construct the table device 17 is grouped into a cell group which performs a 1-bit, 2-bit, 3-bit, or 4-bit comparison, each variable length code of the variable length decoding table shown in FIG. 21 is divided into units of 1 to 4 bits and an assignment of comparisons as shown in FIG. 22 is carried out.

The comparison object bit pattern which each of the nodes n0 to n13 which is a comparison point has (e.g., '011' in the case of the node n3) is compared with a portion of the input bit sequence, the portion having the same number of bits, which is counted from the leading bit of the input bit sequence, as the comparison object bit pattern (in the case of the node n3, the 3-bit leading portion of the input bit sequence). When there is a match between them, a subsequent bit sequence of the input bit sequence is compared with the comparison object bit pattern in each node which is a "child" connected to the node (i.e., each node which branches from the node and is connected to the node, e.g., each of the "child" nodes n5 to n10 of the node n3). When the input bit sequence is '01100', '00' which is the subsequent bit sequence is compared with the comparison object bit pattern in the node n5.

Figure 23:
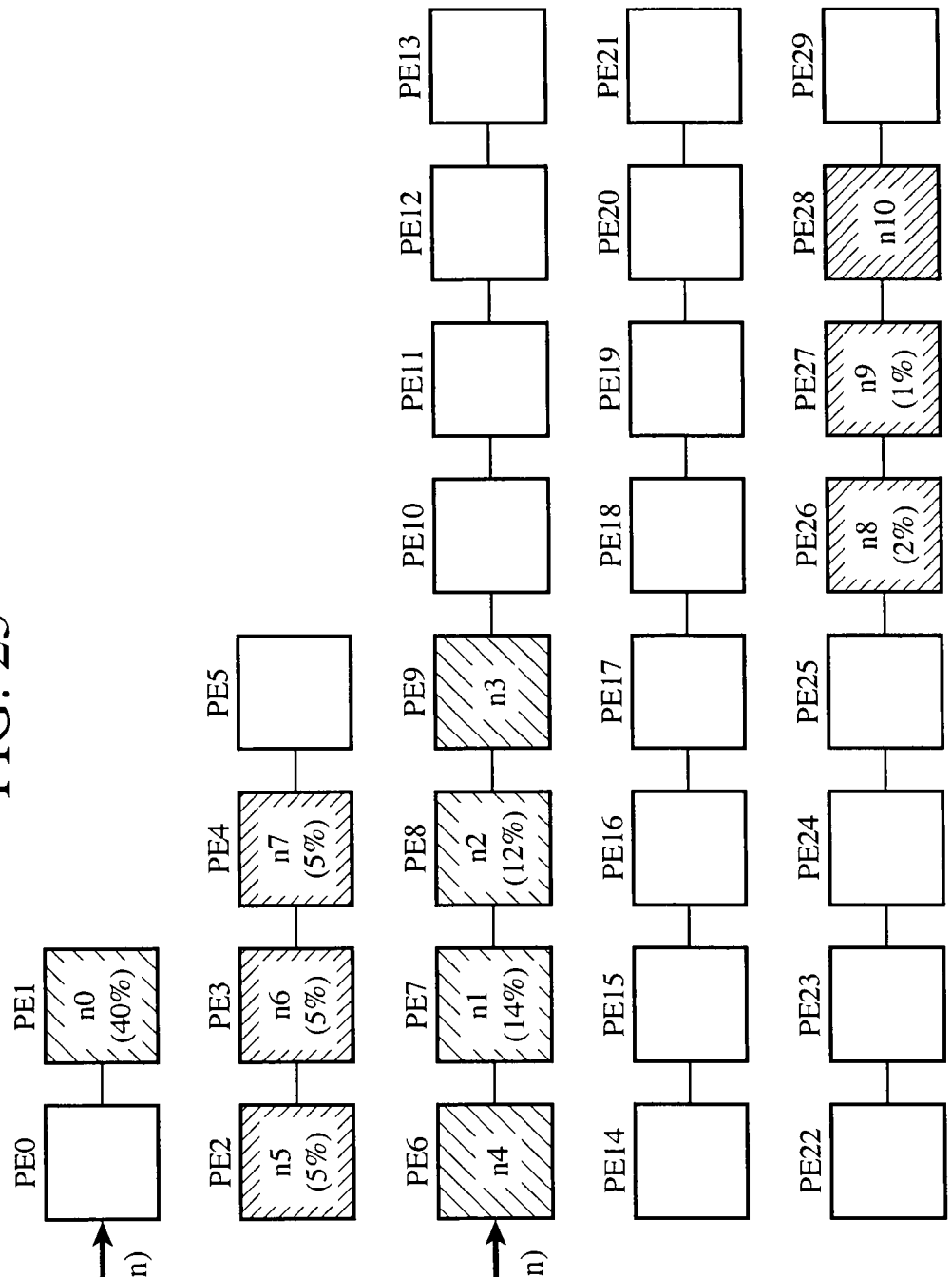
FIG. 23 is a view for explaining a case in which nodes shown in FIG. 22 are mapped to cells shown in FIG. 19.

FIG. 23 is a view for explaining a case in which the plurality of nodes n0 to n13 shown in FIG. 22 are mapped to the plurality of cells PE0 to PE29 shown in FIG. 19. In FIG. 23, the node n0 is mapped to the cell PE1, the node n5 is mapped to the cell PE2, the node n6 is mapped to the cell PE3, the node n7 is mapped to the cell PE4, the node n4 is mapped to the cell PE6, the node n1 is mapped to the cell PE7, the node n2 is mapped to the cell PE8, the node n3 is mapped to the cell PE9, the node n8 is mapped to the cell PE26, the node n9 is mapped to the cell PE27, and the node n10 is mapped to the cell PE28. As shown in FIG. 22, because the comparison object bit patterns of the nodes n11 to n13 are the same as those of the nodes n5 to n7, respectively, the nodes n11 to n13 are mapped to other registers of the cells PE2 to PE4, respectively.

In a first-time comparison, the comparison instruction signals R0 and R2 are inputted to the table device, as shown in FIG. 19, and the cells PE0, PE1, and PE6 to PE13 perform a comparison between their respective comparison object values 119 and the input bit sequence. In this case, as designated by identical sloped lines in FIGS. 22 and 23, each of the cell PE1 to which the node n0 is mapped, the cell PE6 to which the node n4 is mapped, the cell PE7 to which the node n1 is mapped, the cell PE8 to which the node n2 is mapped, and the cell PE9 to which the node n3 is mapped performs the first-time comparison. At that time, a probability that the input bit sequence is '1', '001', or '010', and either of the cells PE0, PE7, and PE8 completes the comparison operation to provide a comparison result showing a match is 66%.

When the matching is not completed, i.e., when the cell PE6 provides a comparison result showing a match, the table device carries out switching among the registers and changes the cell group to which the comparison instruction signal is to be inputted so as to reconstruct the table. When the cell PE9 provides a comparison result showing a match, the table device shifts to a second-time comparison by changing the cell group to which the table device inputs the comparison instruction signal without performing any switching among the registers, and, as designated by identical sloped lines in FIGS. 22 and 23, each of the cell PE2 to which the node n5 is mapped, the cell PE3 to which the node n6 is mapped, the cell PE4 to which the node n7 is mapped, the cell PE26 to which the node n8 is mapped, the cell PE27 to which the node n9 is mapped, and the cell PE28 to which the node n10 is mapped performs the comparison.

Therefore, for a code having a comparison match probability of 66%, the table device can acquire output data without reconstructing the table and without changing the comparison instruction signal, and can reduce the number of times that switching among the registers is performed and the number of times that the comparison instruction signal is changed to a minimum. The operation of reconstructing the table will be mentioned below.

Next, an example of the variable length decoding operation will be explained.

Figure 24:
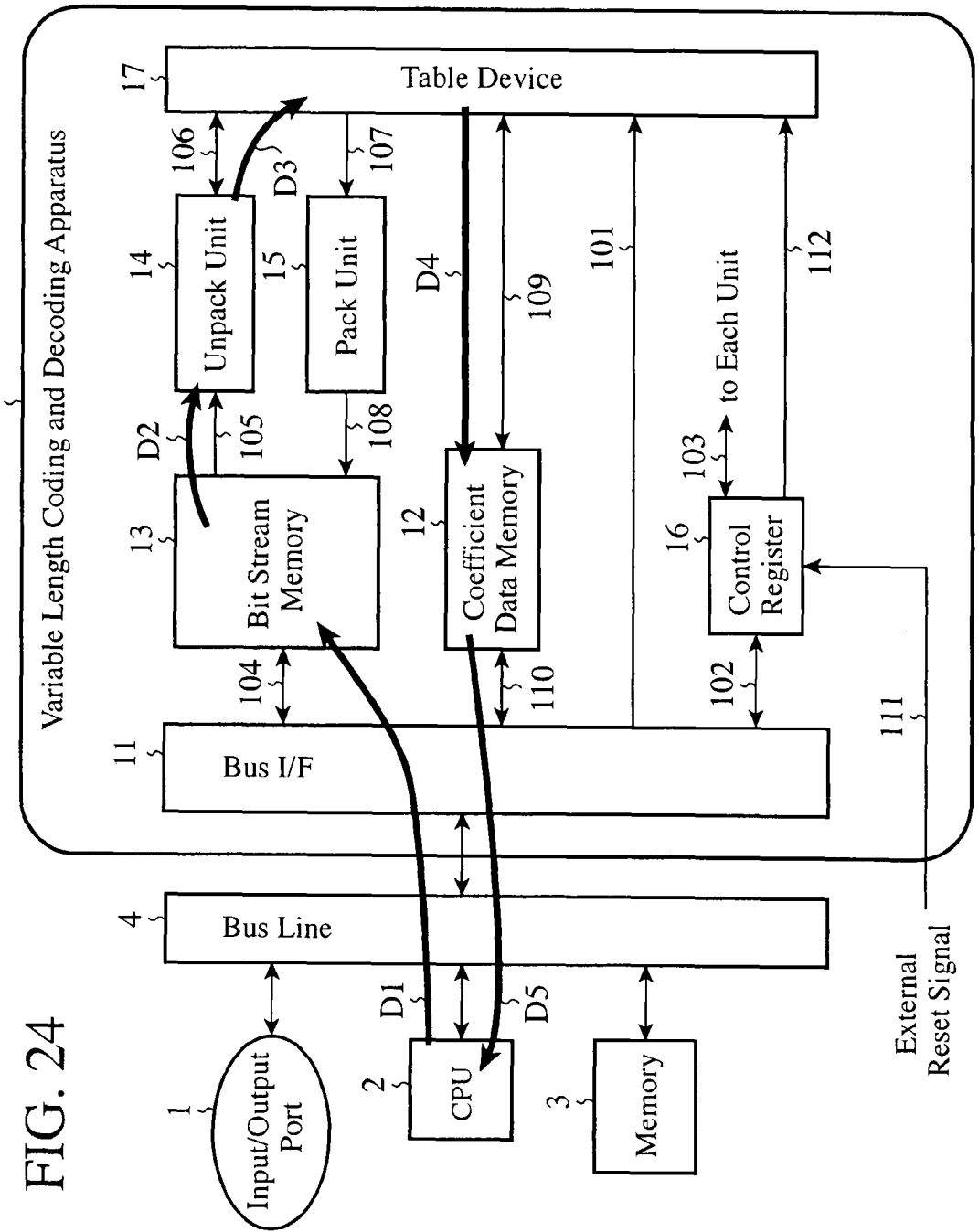
FIG. 24 is a diagram for explaining an example of a variable length decoding operation performed by the variable length coding and decoding apparatus shown in FIG. 18.

FIG. 24 is a diagram for explaining an example of the variable length decoding operation performed by the variable length coding and decoding apparatus shown in FIG. 18, and an explanation will be made with reference to this figure. In FIG. 24, the same components as those shown in FIG. 18 are designated by the same reference numerals as those shown in the figure, and an explanation of the signal lines via which signals and data are transmitted and so on will be omitted hereafter. The decoding operation is performed after the above-mentioned configuration data are written to the cells of the table device 17. First, the CPU 2 writes bit stream data corresponding to block data about one macro block in the bit stream memory 13 via the bus I/F 11 (an arrow D1 shown in FIG. 24).

After writing the bit stream data, the CPU writes a decoding start signal in the decoding start instruction register included in the control register 16, furnishes an input data selection signal 112 to the MUX 30 shown in FIG. 19, and selects bit stream data as input data 115 shown in FIG. 19 to start the decoding operation. The unpack unit 14 reads a bit stream corresponding to block data about one macro block from the bit stream memory 13 in units of a specific number of bits (an arrow D2 shown in FIG. 24), and shifts the bit stream data according to a shift value specified by the CPU 2 or the table device 17 to output an always-effective bit stream having a specific number of bits to the table device 17 (an arrow D3 shown in FIG. 24).

The table device 17 carries out the variable length decoding according to the inputted bit stream having the above-mentioned specific number of bits, and outputs coefficient data to the coefficient data memory 12 (an arrow D4 shown in FIG. 24), and, when clearing the number of times that the table is used, simultaneously notifies the CPU 2 that the decoding has been completed with an interrupt signal. The CPU 2 which has received the interrupt signal indicating the completion of the decoding reads the decoded result from the coefficient data memory 12 via the bus I/F 11 (an arrow D5 shown in FIG. 24).

Figure 25:
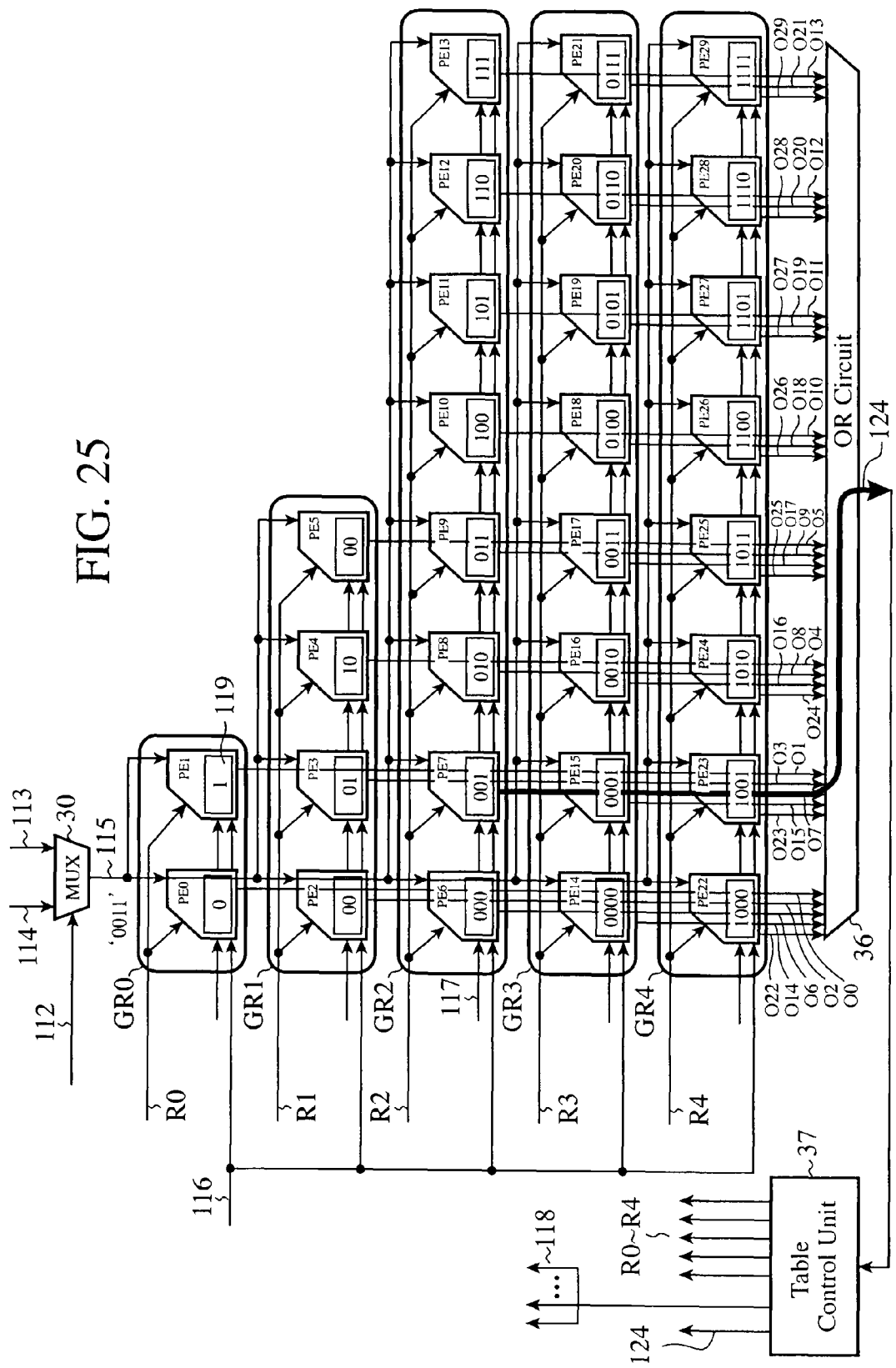
FIG. 25 is a diagram showing an example of the variable length decoding operation performed by the variable length coding and decoding apparatus in accordance with Embodiment 4 of the present invention.

By taking, as an example, the table shown in FIGS. 21 and 22, and comparison operations performed in the table device 17 at the time of the variable length decoding will be explained. FIG. 25 is a view showing an example of the variable length decoding operation using the variable length decoding table shown in FIG. 19. As shown in FIG. 25, it is assumed first that the bit stream having the specific number of bits which is inputted as the input data 115 is '0011'.

In the decoding mode, the bit stream data 113 are selected, as the input data 115, i.e., the bit stream data '0011', by the MUX 30 according to the input data selection signal 112. A leading portion of the bit stream data '0011' is inputted to each of the plurality of cells PE0 to PE29, the leading portion having the same bit length as the comparison object value 119 of each of the plurality of cells PE0 to PE29.

That is, '0' is inputted to each of the cells PE0 and PE1 having the comparison object value 119 whose bit length is one bit, '00' is inputted to each of the cells PE2 to PE5 having the comparison object value 119 whose bit length is two bits, '001' is inputted to each of the cells PE6 to PE13 having the comparison object value 119 whose bit length is three bits, and '0011' is inputted to each of the cells PE14 to PE29 having the comparison object value 119 whose bit length is four bits.

On the other hand, the table control unit 37 refers to the setting state, as shown in FIG. 24, of the control register 16, and reads an initial code which is used at the time of the start of comparison operations and which specifies both the selection of a register of the output value register group 32 shown in FIG. 20, and the cell group which is made to start comparison operations, and generates the comparison instruction signals R0 and R2 and the register selection signal 118 on the basis of this initial code.

The register selection signal 118 is inputted to all the cells PE0 to PE29, and each of the cells selects a register which is to be used for the first time from the output value register group by using the MUX 34 shown in FIG. 20. The comparison instruction signal R0 inputted to the cell group GR0 is provided to the comparator 31 shown in FIG. 20 and included in each of the cells PE0 and PE1, and the comparison instruction signal R2 inputted to the cell group GR2 is provided to the comparator 31 included in each of the cells PE6 to PE13.

Each cell in which the comparator 31 thereof receives the comparison instruction signal provided thereto compares the bit stream inputted thereto with the specific comparison object value 119 fixed therein by using the comparator 31. More specifically, the cell PE0 compares the bit stream '0' with its comparison object value '0', the cell PE1 compares the bit stream '0' with its comparison object value '1', and the cell PE6 compares the bit stream '001' with its comparison object value '000'.

Moreover, the cell PE7 compares the bit stream '001' with its comparison object value '001', the cell PE8 compares the bit stream '001' with its comparison object value '010', and the cell PE9 compares the bit stream '001' with its comparison object value '011'. Furthermore, the cell PE10 compares the bit stream '001' with its comparison object value '100', the cell PE11 compares the bit stream '001' with its comparison object value '101', the cell PE12 compares the bit stream '001' with its comparison object value '110', and the cell PE13 compares the bit stream '001' with its comparison object value '111'.

In this case, the cells PE0 and PE7 provide comparison results showing a match, and a matching signal 122 is outputted from the comparator 31 of each of the cells. However, because no configuration data are mapped to the cell PE0, any configuration data are not written in the corresponding register of the output value register group 32 of the cell PE0 and a value reset to '0' is set up in the register.

On the other hand, as shown in FIG. 23, the configuration data corresponding to the node n1 shown in FIG. 22 are mapped to the cell PE7, and the cell PE7 is a leaf. Therefore, the corresponding output value (the orthogonal transformation coefficient) which is held by the output value register group 32 is extracted by the MUX 34 shown in FIG. 20. As shown in FIG. 20, the MUX 35 extracts the output value 121 extracted from the output value register group 32 according to the matching signal 122 outputted from the comparator 31, and the cell PE7 outputs both the output data 123 which are this output value 121 and the matching signal 122 as an output O7 to the OR circuit 36.

When some matching signals are outputted, the OR circuit 36 implements an OR operation on the signals O0 to O29 outputted from all the cells PE0 to PE29, and outputs the OR operation result as a decoded result (a data output 124), as shown in FIG. 25. In this example, because the cells to which the configuration data are mapped and which provide comparison results showing a match are only the cell PE7, and the output values of the other cells are '0', the data output 124 of the OR circuit 36 is equal to the output value O7 of the cell PE7.

When the bit stream data which are the input data 115 are, for example, '0001', the cells whose comparison object values match the bit stream data at that time are the cells PE0 and PE6. However, because no configuration data are mapped to the cell PE0, the output value O0 is '0'.

On the other hand, because the configuration data corresponding to the node n4 shown in FIG. 22 are mapped to the cell PE6 and this cell is set up as a branch, as shown in FIG. 23, the output value O6 is the branch code set to the output value register group 32 shown in FIG. 20. As a result, the data output 124 of the OR circuit 36 is the branch code set to the output value register group 32 of the cell PE6.

On the basis of this branch code, the table control unit 37 changes the register selection signal 118 which is inputted to the MUX 34 shown in FIG. 20, and also changes the cell group to which the table control unit inputs the comparison instruction signal the next time. As a result, a change and a selection of the registers which have already held the data are carried out, and the variable length decoding table is reconstructed.

Thus, a new register of the output value register group 32 is selected according to the register selection signal 118 and either of the comparison instruction signals R0 to R4 is inputted to the table device, so that a comparison of a portion at the branch point and lower points (lower bits than "000") can be made. This table reconstruction can be carried out during one clock until a new register selection signal 118 and a comparison instruction signal R are outputted since the output of the branch code.

When the bit stream data which are the input data 115 are, for example, '0110', the cells whose comparison object values match the bit stream data at that time are the cells PE0 and PE9. However, because no configuration data are mapped to the cell PE0, the output value O0 is '0'.

On the other hand, because the configuration data corresponding to the node n3 shown in FIG. 22 are mapped to the cell PE9 and this cell is set up as a branch, as shown in FIG. 23, the output value O9 is the branch code set to the output value register group 32 shown in FIG. 20, and is inputted to the table control unit 37 as the data output 124 of the OR circuit 36.

In this case, because bits at the branch point and lower points (lower bits than "011") exist in the already-selected register, the table control unit 37 changes only the cell group to which the table control unit inputs the comparison instruction signal the next time without changing the register selection signal 118. The next comparison is started during one clock until the cell group to which the comparison instruction signal is inputted is changed.

Like in the case of the previously-explained variable length decoding, the variable length coding can be carried out by using the same circuit. That is, in the variable length coding, in FIG. 19, the input data 115 inputted to the table device 17 are coefficient data 114 read from the coefficient data memory 12 shown in FIG. 18, and have a fixed length. Furthermore, the output of the table device 17 is a bit stream outputted to the pack unit 15, and has a variable length.

Next, the variable length coding operation will be explained.

Figure 26:
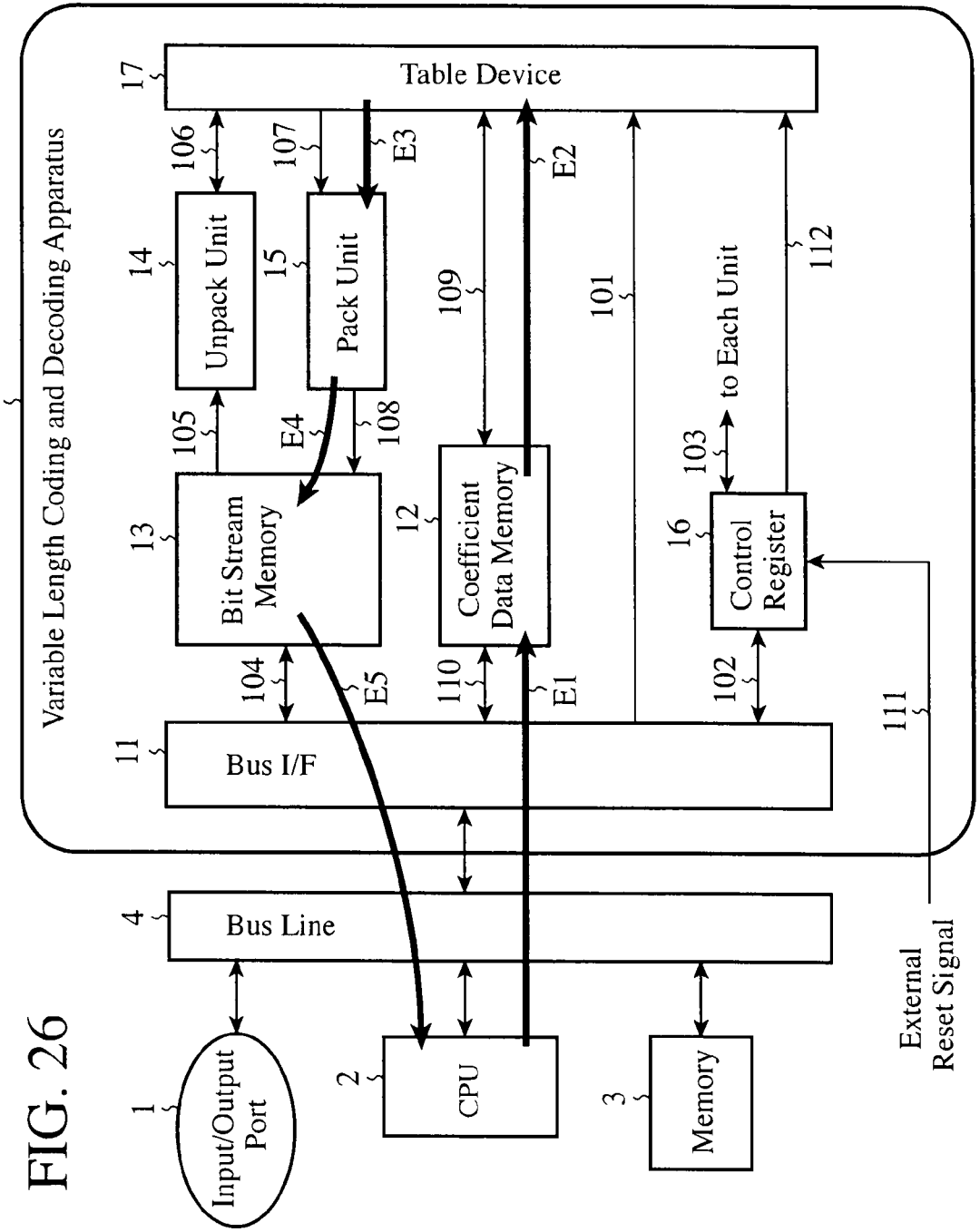
FIG. 26 is a diagram showing an example of a variable length coding operation performed by the variable length coding and decoding apparatus in accordance with Embodiment 4 of the present invention.

FIG. 26 is a diagram showing an example of the variable length coding operation performed by the variable length coding and decoding apparatus in accordance with Embodiment 4. In FIG. 26, the same components as those shown in FIG. 18 are designated by the same reference numerals as those shown in the figure, and an explanation of the signal lines via which signals and data are transmitted and so on will be omitted hereafter. The coding operation is performed after configuration data 116 for coding are written in the cells of the table device 17 in the configuration mode so that the variable length coding table is formed.

First, the CPU 2 writes coefficient data for coding of data corresponding to block data about one macro block in the coefficient data memory 12 via the bus I/F 11 (an arrow E1 shown in FIG. 26). After writing the coefficient data, the CPU writes a coding start signal in a coding start instruction register included in the control register 16, furnishes an input data selection signal 112 to the MUX 30 shown in FIG. 19, and starts the coding operation by selecting the coefficient data as input data 115 shown in FIG. 19.

The table device 17 reads the coefficient data from the coefficient data memory 12 in units of a certain specific number of bits (an arrow E2 shown in FIG. 26), and carries out the variable length coding according to this coefficient data inputted thereto in units of the specific number of bits, and outputs coded data to the pack unit 15 (an arrow E3 shown in FIG. 26). The pack unit 15 stores the converted bit stream in the bit stream memory 13 in units of bits, such as in units of the data width of the CPU bus (an arrow E4 shown in FIG. 26), and simultaneously notifies the CPU 2 that the coding of one macro block is completed with an interrupt signal. The CPU 2 which has received the interrupt signal showing the completion of the coding reads the coded result from the bit stream memory 13 via the bus I/F 11 (an arrow E5 shown in FIG. 26).

In the variable length coding mode, the coefficient data which are selectively inputted to the cells in FIGS. 19 and 20 have a fixed bit length. The other process steps are the same as those previously explained in the above-mentioned decoding mode, the explanation of the other process steps will be omitted hereafter.

As mentioned above, in accordance with this Embodiment 4, the table device 17 includes: the plurality of cells PE0 to PE29 each of which includes the comparator 31 for reading the input data to be coded or decoded in units of bits corresponding to the bit length of the comparison object value to compare the input data with the comparison object value, and the output value register group 32 having a plurality of registers for holding configuration data 116 including an output value of coding or decoding corresponding to the comparison object value, and each of which outputs the contents held by the registers according to the comparison result of the comparator 31; the OR circuit 36 for implementing the OR operation on the output values from the cells; and the table control unit 37 for specifying the cells in each of which the comparator 31 is made to perform a comparison operation for each of the cell groups, into which the plurality of cells are grouped according to the bit lengths of their comparison object values, and also specifying the registers which are made to output the contents held thereby according to the comparison results on the basis of either the initial code set up at the time of the start of coding or decoding or the branch code included in the configuration data 116, so as to acquire output values of coding or decoding corresponding to the input data as the output of the OR circuit 36. Therefore, the table device in accordance with this Embodiment 4 can set up the configuration data in such way that the configuration data comply with a variable length coding method or a variable length decoding method based on the international standards, and the table device can construct a table which can be dynamically restructured for any of various methods. Especially, each cell can select and change one of the registers thereof which it will use from among the plurality of registers which the output value register group 32 has during one clock. Furthermore, even in a case in which the number of bits which can be compared using a set of cells which are being currently used does not satisfy a maximum number of bits which should be compared, a comparison of the maximum number of bits can be made by reconstructing the cells.

Furthermore, because the table device has only to write the configuration data 116 in the register specified by the decoded signal 120 which is obtained by decoding the register specification address signal 117, the time required for the writing process can be reduced. In addition, because the types of registers to which the configuration data are set are reduced from the four types of register groups including a connection information register group, a bit selection register group, a comparison object register group, and an output value register group, as shown in patent reference 1, to only one type of output value register group 32, the time required for the writing process can be reduced.

Furthermore, the variable length coding and decoding apparatus is constructed in such a way as to include the coefficient data memory 12 which receives and stores coefficient data to be variable length coded or coefficient data variable length decoded, the bit stream memory 13 which stores a bit stream to be decoded or a bit stream which is a coded result, the pack unit 15 which packs a bit stream of output values of variable length coding which is acquired as output data of the table device 17 in data in units of a predetermined number of bits, and stores the data in the bit stream memory 13 when the variable length coding and decoding apparatus performs the coding operation, the unpack unit 14 which shifts a fixed-length bit stream which the unpack unit reads from the bit stream to be decoded in units of a predetermined number of bits by a number of bits which is consumed by the table device 17, and outputs the bit stream as input data to the table device 17 when the variable length coding and decoding apparatus performs the decoding operation, the control register 16 which sets up an initial code specifying both a cell group in the table device 17 and a register in the output value register group 32 which is made to output contents held thereby according to the comparison result obtained by the comparator 31 in response to an instruction from the CPU 2 disposed outside when starting the coding or the decoding, and the transmission unit which includes the bus line 4 and the bus I/F 11, and which transmits the conversion table which should be set to the table device 17 from the CPU 2 disposed outside, and the register specification address signal specifying a register in the output value register group 32 to which the conversion table is to be written to the table device 17. Therefore, because the variable length coding and decoding apparatus can perform the variable length coding and decoding by using one circuit, the variable length coding and decoding apparatus provides an advantage of being able to come down in size and reduce its power consumption.

In this Embodiment 4, the variable length coding and decoding apparatus is explained. As an alternative, a variable length coding apparatus or a variable length decoding apparatus can be constructed independently by using the table device 17 of this embodiment. Also in this case in which a variable length coding apparatus or a variable length decoding apparatus is constructed independently by using the table device, there can be provided an advantage in the variable length coding in accordance with this Embodiment 4, or an advantage in the variable length decoding in accordance with this Embodiment 4.

Industrial Applicability

As mentioned above, the table device in accordance with the present invention is suitable for use in a variable length coding apparatus, a variable length decoding apparatus, or a variable length coding and decoding apparatus which needs to support various variable length coding methods or various variable length decoding methods including international standard methods when carrying out variable length coding or variable length decoding.

The invention claimed is:

1. A table device comprising:
   a configuration memory configured to hold a conversion table including data conversion values indicating a branch code and a result of variable length coding or a result of variable length decoding, where the data conversion values are constructed in a form of a search tree, and where the branch code indicates information on a child node connected with a branch node in the search tree;
   a plurality of cells to which nodes of the search tree indicated by the conversion table in the configuration memory are assigned by mapping, to each of which a specific comparison object value is assigned, and each of which is configured to compare said comparison object value with input data when receiving a comparison instruction signal, and output a matching signal when said comparison object value matches said input data;
   a cell number output unit configured to output a cell number indicating a cell which is included in said plurality of cells and which outputs the matching signal;
   a node specifying unit configured to specify a node corresponding to the cell number outputted from said cell number output unit from among nodes assigned to the plurality of cells; and a cell control unit configured to acquire a data conversion value assigned to the node specified by said node specifying unit from the conversion table in said configuration memory, output the acquired data conversion value to outside said table device when said data conversion value is data showing a result of variable length coding or a result of variable length decoding, and, when said data conversion value is a branch code of the search tree, output another comparison instruction signal to a cell to which a child node indicated by said branch code is assigned.

2. The table device according to claim 1, wherein
the plurality of cells are grouped into cell groups according to a comparison object value having a same number of bits, and
the cell control unit outputs a same comparison instruction signal to each of cells belonging to a same cell group.

3. The table device according to claim 1, wherein
the cell control unit outputs a table number showing a conversion table to be used, and
the node specifying unit implements said specification of the node by using nodes of the search tree indicated by the conversion table shown by the table number outputted from said cell control unit.

4. A variable length coding apparatus comprising:
a coefficient data storing unit configured to store coefficient data to be variable length coded;
a conversion table output unit configured to output a conversion table including data conversion values indicating a branch code and a result of variable length coding, where the data conversion values are constructed in a form of a search tree, and where the branch code indicates information on a child node connected with a branch node in the search tree;
a configuration memory configured to hold the conversion table outputted from said conversion table output unit;
a plurality of cells to which nodes of the search tree indicated by the conversion table in the configuration memory are assigned by mapping, to each of which a specific comparison object value is assigned, and each of which is configured to compare said comparison object value with the coefficient data stored in said coefficient data storing unit when receiving a comparison instruction signal, and output a matching signal when said comparison object value matches said coefficient data;
a cell number output unit configured to output a cell number showing a cell which is included in said plurality of cells and which outputs the matching signal;
a node specifying unit configured to specify a node corresponding to the cell number outputted from said cell number output unit from among nodes assigned to the plurality of cells;
a cell control unit configured to acquire a data conversion value assigned to the node specified by said node specifying unit from the conversion table in said configuration memory, output the acquired data conversion value when said data conversion value is a bit stream, and, when said data conversion value is a branch code of said search tree, output another comparison instruction signal to a cell to which a child node indicated by said branch code is assigned; and
a packing unit configured to pack the bit stream outputted from said cell control unit in data in units of bits.

5. A variable length decoding apparatus comprising:
a bit stream storing unit configured to store a bit stream to be variable length decoded;
a bit stream output unit configured to read the bit stream from said bit stream storing unit in units of bits, and output a bit stream having a fixed length by using the read bit stream;
a conversion table output unit configured to output a conversion table including data conversion values indicating a branch code and a result of variable length decoding, where the data conversion values are constructed in a form of a search tree, and where the branch code indicates information on a child node connected with a branch node in the search tree;
a configuration memory configured to hold the conversion table outputted from said conversion table output unit;
a plurality of cells to which nodes of the search tree indicated by the conversion table in the configuration memory are assigned by mapping, to each of which a specific comparison object value is assigned, and each of which is configured to compare said comparison object value with the bit stream outputted from said bit stream output unit when receiving a comparison instruction signal, and output a matching signal when said comparison object value matches said bit stream;
a cell number output unit configured to output a cell number showing a cell which is included in said plurality of cells and which outputs the matching signal;
a node specifying unit configured to specify a node corresponding to the cell number outputted from said cell number output unit from among nodes assigned to the plurality of cells; and
a cell control unit configured to acquire a data conversion value assigned to the node specified by said node specifying unit from the conversion table in said configuration memory, output the acquired data conversion value when said data conversion value is coefficient data, and, when said data conversion value is a branch code of said search tree, output another comparison instruction signal to a cell to which a child node indicated by said branch code is assigned.

6. A variable length coding and decoding apparatus comprising:
a coefficient data storing unit configured to store coefficient data to be variable length coded;
a bit stream storing unit configured to store a bit stream to be variable length decoded;
a bit stream output unit configured to read the bit stream from said bit stream storing unit in units of bits, and output a bit stream having a fixed length by using the read bit stream;
a conversion table output unit configured to output a conversion table including data conversion values indicating a branch code and a result of variable length coding or a result of variable length decoding, where the data conversion values are constructed in a form of a search tree, and where the branch code indicates information on a child node connected with a branch node in the search tree;
a configuration memory configured to hold the conversion table outputted from said conversion table output unit;
a plurality of cells to which nodes of the search tree indicated by the conversion table in the configuration memory are assigned by mapping, to each of which a specific comparison object value is assigned, and each of which is configured to compare said comparison object value with said coefficient data or said bit stream unit when receiving a comparison instruction signal, and output a matching signal when said comparison object value matches said coefficient data or said bit stream;

a cell number output unit configured to output a cell number showing a cell which is included in said plurality of cells and which outputs the matching signal;
a node specifying unit configured to specify a node corresponding to the cell number outputted from said cell number output unit from among nodes assigned to the plurality of cells;
a cell control unit configured to acquire a data conversion value assigned to the node specified by said node specifying unit from the conversion table in said configuration memory, output the acquired data conversion value when said data conversion value is a bit stream or coefficient data, and, when said data conversion value is a branch code of said search tree, output another comparison instruction signal to a cell to which a child node indicated by said branch code is assigned; and
a packing unit configured to pack the bit stream outputted from said cell control unit in data in units of bits.

7. A table device comprising:
a plurality of cells to each of which a specific comparison object value is assigned, each of which has a comparator and a plurality of registers, where the comparator is for comparing said comparison object value with input data when receiving a comparison instruction signal, where the plurality of registers are for holding a conversion table including at least one data conversion value corresponding to said comparison object value, where each of the cells outputs a data conversion value held by one of the registers which corresponds to a register selection signal when a result of the comparison by said comparator shows that the comparison object value matches the input data, and, when the result of the comparison by said comparator shows that the comparison object value does not match the input data, each of the cells outputs a zero value as said data conversion value, where the data conversion values are constructed in a form of a search tree, and indicate a branch code and a result of variable length coding or a result of variable length decoding, where the branch code indicates information on a child node connected with a branch node in the search tree, and where nodes of the search tree are assigned to the plurality of cells by mapping;
an OR circuit configured to implement an OR operation on the data conversion values outputted from said plurality of cells; and
a cell control unit configured to output the data conversion values through the OR operation by the OR circuit to outside said table device when the data conversion values are a coded result or a decoded result, when said data conversion values are a branch code, output another comparison instruction signal to a cell to which a child node indicated by said branch code is assigned, and update the register selection signal according to the branch code, wherein
the plurality of cells are grouped into cell groups according to a comparison object value having a same number of bits, and
the cell control unit outputs a same comparison instruction signal to each of cells belonging to a same cell group.

8. The table device according to claim 7, wherein the cell control unit generates the register selection signal by using a register selection value included in either an initial code which is set up at a time of starting variable length coding or variable length decoding or the branch code, outputs the generated register selection signal to the plurality of cells, and also outputs the comparison instruction signal to cells which are included in said plurality of cells and which correspond to a cell group specification code included in the initial code or the branch code.

9. The table device according to claim 7, wherein each of the plurality of cells has an address decoder for writing a conversion table in the plurality of registers.

10. A variable length coding apparatus comprising:
a coefficient data storing unit configured to store coefficient data to be variable length coded;
a conversion table output unit configured to output a conversion table including data conversion values indicating a branch code and a result of variable length coding, where the data conversion values are constructed in a form of a search tree, and where the branch code indicates information on a child node connected with a branch node in the search tree;
a plurality of cells to which nodes of the search tree indicated by the conversion table are assigned by mapping, to each of which a specific comparison object value is assigned, each of which has a comparator and a plurality of registers, where the comparator is for comparing said comparison object value with input data when receiving a comparison instruction signal, where the plurality of registers are for holding said conversion table including data conversion value[s] corresponding to said comparison object value, where each of the cells outputs a data conversion value held by one of the registers which corresponds to a register selection signal when a result of the comparison by said comparator shows that the comparison object value matches the input data, and, when the result of the comparison by said comparator shows that the comparison object value does not match the input data, each of the cells outputs a zero value as said data conversion value, where the data conversion values indicate a branch code and a result of variable length coding, where the branch code indicates information on a child node connected with a branch node in the search tree;
an OR circuit configured to implement an OR operation on the data conversion values outputted from said plurality of cells;
a cell control unit configured to output the data conversion values through the OR operation by the OR circuit to outside said table device when the data conversion values are a bit stream, when said data conversion values are a branch code, output another comparison instruction signal to a cell to which a child node indicated by said branch code is assigned, and update the register selection signal according to the branch code; and
a packing unit configured to pack the bit stream outputted from said cell control unit in data in units of bits, wherein
the plurality of cells are grouped into cell groups according to a comparison object value having a same number of bits, and
the cell control unit outputs a same comparison instruction signal to each of cells belonging to a same cell group.

11. A variable length decoding apparatus comprising:
a bit stream storing unit configured to store a bit stream to be variable length decoded;
a bit stream output unit configured to read the bit stream from said bit stream storing unit in units of bits, and output a bit stream having a fixed length by using the read bit stream;
a conversion table output unit configured to output a conversion table including data conversion values indicating a branch code and a result of variable length decoding, where the data conversion values are constructed in a form of a search tree, and where the branch code indicates information on a child node connected with a branch node in the search tree;

a plurality of cells to which nodes of the search tree indicated by the conversion table in the configuration memory are assigned by mapping, to each of which a specific comparison object value is assigned, each of which has a comparator and a plurality of registers, where the comparator is for comparing said comparison object value with the bit stream outputted from said bit stream output unit when receiving a comparison instruction signal, where the plurality of registers are for holding said conversion table including a data conversion value corresponding to said comparison object value, where each of the cells outputs a data conversion value held by one of the registers which corresponds to a register selection signal when a result of the comparison by said comparator shows that the comparison object value matches the bit stream, and, when the result of the comparison by said comparator shows that the comparison object value does not match the bit stream, each of the cells outputs a zero value as said data conversion value, where the data conversion values indicate a branch code and a result of variable length decoding, where the branch code indicates information on a child node connected with a branch node in the search tree;

an OR circuit configured to implement an OR operation on the data conversion values outputted from said plurality of cells; and a cell control unit configured to output the data conversion values through the OR operation by the OR circuit to outside said table device when the data conversion values are coefficient data, when said data conversion values are a branch code, output another comparison instruction signal to a cell to which a child node indicated by said branch code is assigned and update the register selection signal according to the branch code, wherein the plurality of cells are grouped into cell groups according to a comparison object value having a same number of bits, and the cell control unit outputs a same comparison instruction signal to each of cells belonging to a same cell group.

12. A variable length coding and decoding apparatus comprising:

a coefficient data storing unit configured to store coefficient data to be variable length coded;

a bit stream storing unit configured to store a bit stream to be variable length decoded;

a bit stream output unit configured to read the bit stream from said bit stream storing unit in units of bits, and output a bit stream having a fixed length by using the read bit stream;

a conversion table output unit configured to output a conversion table for variable length coding or variable length decoding which is constructed in a form of a search tree;

a plurality of cells to which nodes of the search tree indicated by the conversion table are assigned by mapping, to each of which a specific comparison object value is assigned, each of which includes a comparator and a plurality of registers, where the comparator is for comparing said comparison object value with said coefficient data or said bit stream when receiving a comparison instruction signal, where the plurality of registers for holding said conversion table including at least one data conversion value corresponding to said comparison object value, where each of cells outputs a data conversion value held by one of the registers which corresponds to a register selection signal when a result of the comparison by said comparator shows that the comparison object value matches the coefficient data or the bit stream, and, when the result of the comparison by said comparator shows that the comparison object value does not match the coefficient data or the bit stream, each of the cells outputs a zero value as said data conversion value, where the data conversion values indicate a branch code and a result of variable length coding or a result of variable length decoding, where the branch code indicates information on a child node connected with a branch node in the search tree;

an OR circuit configured to implement an OR operation on the data conversion values outputted from said plurality of cells;

a cell control unit configured to output the data conversion values through the OR operation by the OR circuit to outside said table device when the data conversion values are coefficient data or a bit stream, when said data conversion values are a branch code, output another comparison instruction signal to a cell to which a child node indicated by said branch code is assigned, and update the register selection signal according to the branch code; and a packing unit configured to pack the bit stream outputted from said cell control unit in data in units of bits, wherein the plurality of cells are grouped into cell groups according to a comparison object value having a same number of bits, and the cell control unit outputs a same comparison instruction signal to each of cells belonging to a same cell group.

* * * * *